United States Patent
Kim et al.

(10) Patent No.: US 12,342,588 B2
(45) Date of Patent: Jun. 24, 2025

(54) SEMICONDUCTOR DEVICE

(71) Applicant: Samsung Electronics Co., Ltd., Suwon-si (KR)

(72) Inventors: Teawon Kim, Hwaseong-si (KR); Yurim Kim, Hwaseong-si (KR); Seohee Park, Daejeon (KR); Kong-Soo Lee, Hwaseong-si (KR); Yong Suk Tak, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 425 days.

(21) Appl. No.: 17/849,086

(22) Filed: Jun. 24, 2022

(65) Prior Publication Data
US 2023/0137072 A1   May 4, 2023

(30) Foreign Application Priority Data

Nov. 2, 2021   (KR) .................. 10-2021-0148955

(51) Int. Cl.
*H10D 62/10* (2025.01)
*H10D 30/62* (2025.01)
*H10D 30/67* (2025.01)

(52) U.S. Cl.
CPC ....... *H10D 62/121* (2025.01); *H10D 30/6211* (2025.01); *H10D 30/6755* (2025.01); *H10D 30/6757* (2025.01)

(58) Field of Classification Search
CPC ............ H10D 62/121; H10D 30/6211; H10D 30/6755; H10D 30/6757; H10D 30/014;
(Continued)

(56) References Cited

U.S. PATENT DOCUMENTS

| 8,343,800 B2 | 1/2013 | Umeda et al. |
| 8,890,159 B2 | 11/2014 | Yamazaki et al. |

(Continued)

FOREIGN PATENT DOCUMENTS

| CN | 111341848 A | 6/2020 |
| KR | 10-2015-0038279 A | 4/2015 |

(Continued)

OTHER PUBLICATIONS

Office Action issued Nov. 20, 2024 in Korean Application No. 10-2021-0148955.

(Continued)

*Primary Examiner* — Karen Kusumakar
*Assistant Examiner* — Shawn Shaw Muslim
(74) *Attorney, Agent, or Firm* — Harness, Dickey & Pierce, P.L.C.

(57) ABSTRACT

A semiconductor device includes a channel layer disposed on a substrate and a gate structure formed on or under the channel layer. The channel layer includes a single-layer oxide semiconductor material, the channel layer includes indium (In), gallium (Ga), and oxygen (O), the channel layer includes a first region, a second region, and a third region, the third region contacting the gate structure, a second region between the first region and the third region, the first region is the closer to the substrate than the second region and the third region, each of the first region and the third region has a concentration of Ga higher than a concentration of In, and the second region has a concentration of In higher than a concentration of Ga.

20 Claims, 19 Drawing Sheets

(58) Field of Classification Search
CPC .... H10D 30/43; H10D 30/6735; H10D 62/80; H10D 30/751; H10D 62/112; H10D 62/124; H10D 62/235; H10D 62/299; H10D 64/511; H10D 64/512; H10D 62/60; B82Y 10/00; H10B 12/053; H10B 12/315; H10B 12/34
See application file for complete search history.

(56) References Cited

U.S. PATENT DOCUMENTS

| | | | |
|---|---|---|---|
| 9,184,245 B2 | 11/2015 | Yamazaki | |
| 9,240,492 B2 | 1/2016 | Yamazaki | |
| 9,412,877 B2 | 8/2016 | Tanaka et al. | |
| 9,425,322 B2 | 8/2016 | Noda et al. | |
| 9,508,864 B2 | 11/2016 | Yamazaki | |
| 10,204,902 B2 | 2/2019 | Lee | |
| 10,217,816 B2 | 2/2019 | Bhuwalka et al. | |
| 10,319,862 B2 | 6/2019 | Ridgeway et al. | |
| 10,847,656 B2 | 11/2020 | Le et al. | |
| 11,171,133 B2 | 11/2021 | Park et al. | |
| 11,171,246 B2 | 11/2021 | Park et al. | |
| 2020/0006572 A1* | 1/2020 | Sharma | H10D 99/00 |
| 2021/0118672 A1 | 4/2021 | Madia et al. | |

FOREIGN PATENT DOCUMENTS

| | | |
|---|---|---|
| KR | 10-2017-0100739 A | 9/2017 |
| KR | 10-2017-0102701 A | 9/2017 |
| KR | 10-2020-0086606 A | 7/2020 |
| KR | 10-2187129 B1 | 12/2020 |
| KR | 10-2021-0080662 A | 7/2021 |
| TW | 201732947 A | 9/2017 |

OTHER PUBLICATIONS

Office Action issued Jun. 26, 2023 in Taiwanese Application No. 111140865.
Request for Submission of an Opinion issued Feb. 3, 2025 in Korean Application No. 10-2021-0148955.

* cited by examiner

SEMICONDUCTOR DEVICE

CROSS-REFERENCE TO RELATED APPLICATION

This application is based on and claims priority under 35 U.S.C. § 119 to Korean Patent Application No. 10-2021-0148955, filed on Nov. 2, 2021, in the Korean Intellectual Property Office, the disclosure of which is incorporated by reference herein in its entirety.

BACKGROUND

The inventive concepts relate to a semiconductor device, and more particularly, to a semiconductor device including a transistor.

Semiconductor devices (or integrated circuit devices) may each include a plurality of transistors. As semiconductor industry advances, semiconductor devices each including transistors are being highly integrated, namely, miniaturized. Highly integrated semiconductor devices need to enhance the performance of transistors (for example, a leakage characteristic and a channel characteristic (i.e., a channel-on characteristic).

SUMMARY

The inventive concepts provide a semiconductor device having an enhanced leakage characteristic and channel characteristic.

According to an aspect of the inventive concepts, there is provided a semiconductor device including a channel layer disposed on a substrate and a gate structure formed on or under the channel layer. The channel layer includes a single-layer oxide semiconductor material, the channel layer includes indium (In), gallium (Ga), and oxygen (O), the channel layer includes a first region, a second region, and a third region, the third region contacting the gate structure, the second region between the first region and the third region, the first region being closer to the substrate than the second region and the third region, each of the first region and the third region has a concentration of Ga is higher than a concentration of In, and the second region has a concentration of In higher than a concentration of Ga.

According to another aspect of the inventive concepts, there is provided a semiconductor device including a channel layer on a substrate, a gate structure formed on or under the channel layer, a first contact structure formed on the channel layer at one side of the gate structure, and a second contact structure formed on the channel layer at the other side of the gate structure.

The channel layer includes a single-layer oxide semiconductor material, the channel layer includes indium (In), gallium (Ga), and oxygen (O), the channel layer includes a first region, a second region, and a third region, the third region contacting the gate structure, the second region being between the first region and the second region, the first region being closer to the substrate than the second region and the third region, each of the first region and the third region has a concentration of Ga higher than a concentration of In, and the second region has a concentration of In higher than a concentration of Ga.

According to another aspect of the inventive concepts, there is provided a semiconductor device including a first conductive line extending in a first direction on a substrate, a second conductive line extending in a second direction, the second direction being vertical to the first direction on the substrate, and a transistor disposed between the first conductive line and the second conductive line.

The transistor includes a channel layer and a gate structure including a gate insulation layer formed on the channel layer and a gate electrode formed on the gate insulation layer, the gate electrode including the second conductive line, the channel layer includes a single-layer oxide semiconductor material, the channel layer includes indium (In), gallium (Ga), and oxygen (O), the channel layer includes a first region, a second region, and a third region contacting the gate electrode, the second region between the first region and the third region, each of the first region and the third region has a concentration of Ga higher than a concentration of In, and the second region has a concentration of In is higher than a concentration of Ga.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EXAMPLE EMBODIMENTS

Hereinafter, example embodiments will be described in detail with reference to the accompanying drawings. The following example embodiments may be implemented as only arbitrary one example embodiment, and the following example embodiments may also be implemented by a combination of one or more example embodiments. Therefore, it is not construed that the inventive concepts are limited to one example embodiment.

Herein, a singular form of elements may include a plural form unless another case is clearly designated in context. The drawings for more clearly describing the inventive concepts are exaggerated and illustrated.

Figure 1:
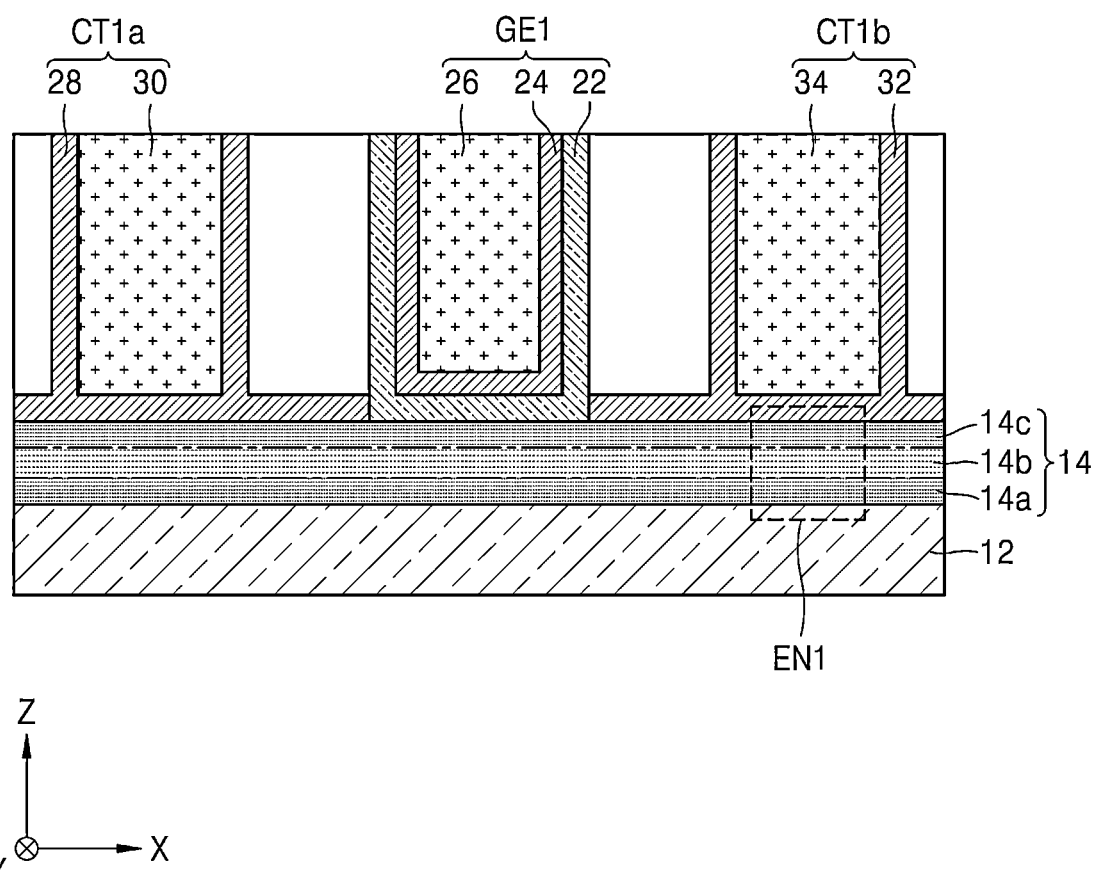
FIG. 1 is a cross-sectional view illustrating a semiconductor device according to an example embodiment.
Figure 2:
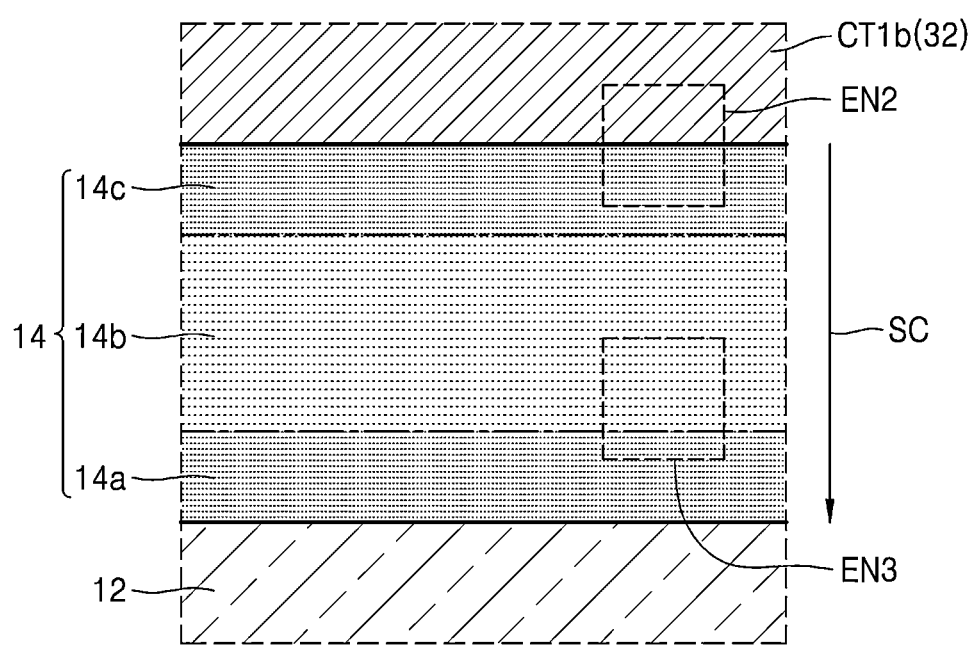
FIG. 2 is an enlarged view of a region "EN1" of FIG. 1.

FIG. 1 is a cross-sectional view illustrating a semiconductor device 10 according to an example embodiment, and FIG. 2 is an enlarged view of a region "EN1" of FIG. 1.

In detail, the semiconductor device 10 may include a substrate 12, a channel layer 14, a gate structure GE1, a first contact structure CT1a, and a second contact structure CT1b. The semiconductor device 10 may be referred to as a transistor. The substrate 12 may include a silicon substrate. The channel layer 14 may be formed on the substrate 12.

The channel layer 14 may include a single-layer oxide semiconductor material. The channel layer 14 may include an indium (In) atom, a gallium (Ga) atom, and an oxygen (O) atom. The channel layer 14 may include a zinc (Zn) atom or a tin (Sn) atom, in addition to an In atom, a Ga atom, and an O atom.

In some example embodiments, the channel layer 14 may include $In_xGa_yZn_zO$ (IGZO), $In_xGa_ySi_zO$ (IGSO), $In_xSn_yGa_zO$ (ITGO), or $In_xGa_yO$ (IGO). In some example embodiments, when the channel layer 14 includes $In_xGa_yZn_zO$ (IGZO), $In_xGa_ySi_zO$ (IGSO), or $In_xSn_yGa_zO$ (ITGO), X may be about 0.3 to about 0.6, Y may be about 0.3 to about 0.6, Z may be about 0.1 to about 0.4, and X+Y+Z may be about 1. The variables X, Y, and Z may be positive numbers less than 1.

The channel layer 14 may have band gap energy which is greater than that of silicon. The channel layer 14 may have band gap energy of about 1.5 eV to about 5.6 eV. The channel layer 14 may have optimal channel performance when the channel layer 14 has band gap energy of about 2.0 eV to about 4.0 eV. The channel layer 14 may be polycrystalline or amorphous, but is not limited thereto.

The channel layer 14 may include a first region 14a which contacts the substrate 12 and is disposed away from the gate structure GE1, a third region 14c which contacts the gate structure GE1, and a second region 14b which is disposed between the first region 14a and the third region 14c. The second region 14b, as illustrated in FIG. 2, may be thicker than the first region 14a and the third region 14c. The first region 14a is closer to the substrate than the second region 14b and the third region 14c.

The second region 14b may be an inner region of the channel layer 14, and the first region 14a and the third region 14c may be an outer region of the channel layer 14. In FIG. 2, for convenience of description, a boundary line between the first region 14a and the second region 14b and a boundary line between the second region 14b and the third region 14c are illustrated in a rectilinear shape, but may be illustrated in a curved shape.

The first region 14a and the third region 14c may be configured so that a composition or concentration of Ga is higher than a composition or concentration of In. In the first region 14a and the third region 14c, when a composition or concentration of Ga is configured to be higher than a composition or concentration of In, an oxygen vacancy generated in the channel layer 14 may be reduced, and thus, a leakage characteristic of the semiconductor device 10 may be enhanced. In other words, the reliability of the semiconductor device 10 may be enhanced.

The second region 14b may be configured so that a composition or concentration of In is higher than a composition or concentration of Ga. In the second region 14b, when a composition or concentration of In is configured to be higher than a composition or concentration of Ga, a carrier concentration (i.e., a concentration of oxygen vacancy) and carrier mobility (i.e., the mobility of oxygen vacancy) may be enhanced, and thus, a channel characteristic (i.e., a channel-on characteristic) may be enhanced.

The gate structure GE1 formed in the channel layer 14 may be formed. The gate structure GE1 may include a gate insulation layer 22 formed on the channel layer 14, a first barrier layer 24 formed on the gate insulation layer 22, and a gate electrode 26 formed on the first barrier layer 24.

The gate insulation layer 22 may include silicon oxide, silicon oxynitride, a high-k dielectric film having a dielectric constant which is higher than that of silicon oxide, or a combination thereof. The high-k dielectric film may include metal oxide or metal oxynitride. In some example embodiments, the high-k dielectric film usable as the gate insulation layer 22 may include $HfO_2$, HfSiO, HfSiON, HfTaO, HfTiO, HfZrO, $ZrO_2$, $Al_2O_3$, or a combination thereof, but is not limited thereto.

The first barrier layer 24 may include metal (for example, titanium or titanium oxide).

The gate electrode 26 may include doped polysilicon, conductive metal nitride, conductive metal silicide, conductive metal oxide, or a combination thereof. In some example embodiments, the gate electrode 26 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto.

The first contact structure CT1a may be formed on the channel layer 14 at one side of the gate structure GE1. The first contact structure CT1a may include a source contact structure. The first contact structure CT1a may be disposed apart from a surface of the substrate 12 in a horizontal direction (i.e., a −X direction).

The first contact structure CT1a may include a second barrier layer 28 and a first contact layer 30. The second barrier layer 28 and the first contact layer 30 may respectively include the same materials as those of the first barrier layer 24 and the gate electrode 26.

The second contact structure CT1b may be formed on the channel layer 14 at the other side of the gate structure GE1. The second contact structure CT1b may include a drain contact structure. The second contact structure CT1b may be disposed apart from the surface of the substrate 12 in a horizontal direction (i.e., an X direction).

The second contact structure CT1b may include a third barrier layer 32 and a second contact layer 34. The third barrier layer 32 and the second contact layer 34 may respectively include the same materials as those of the second barrier layer 28 and the first contact layer 30.

Figure 3:
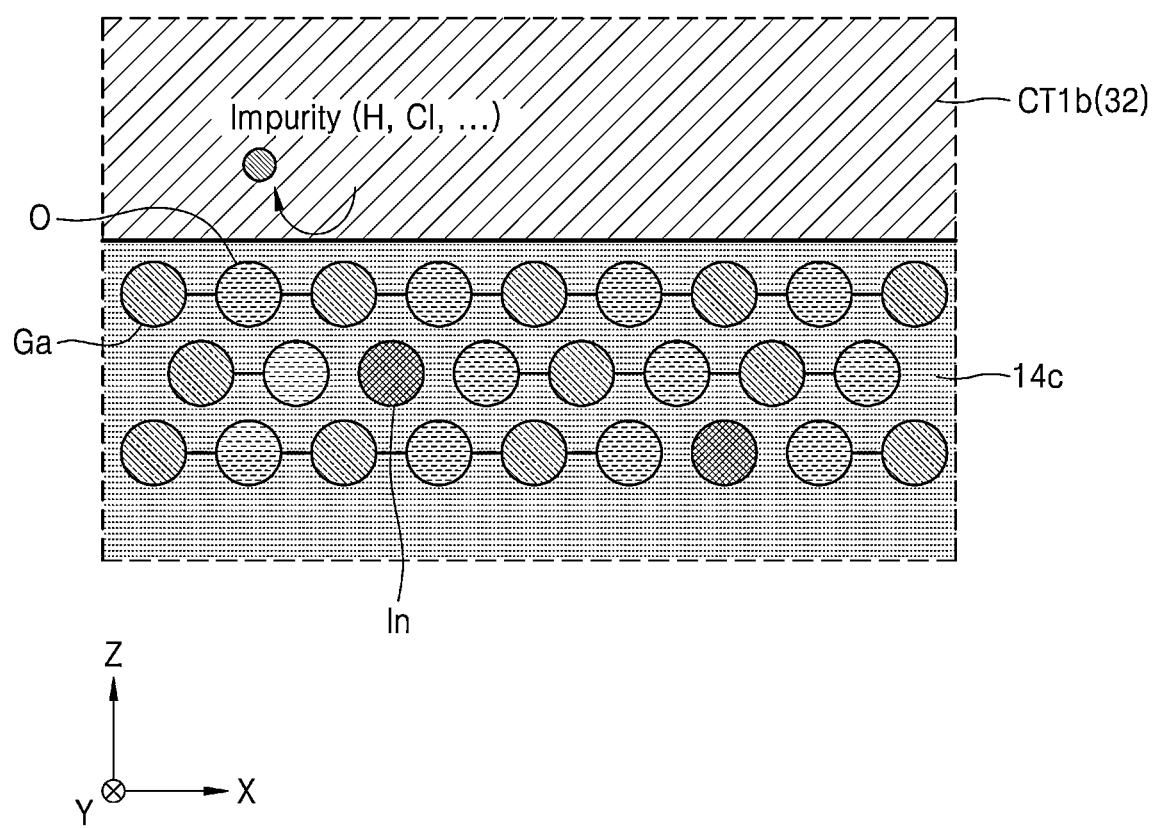
FIGS. 3 and 4 are enlarged views of a region "EN2" and a region "EN3" of FIG. 2, respectively.
Figure 4:
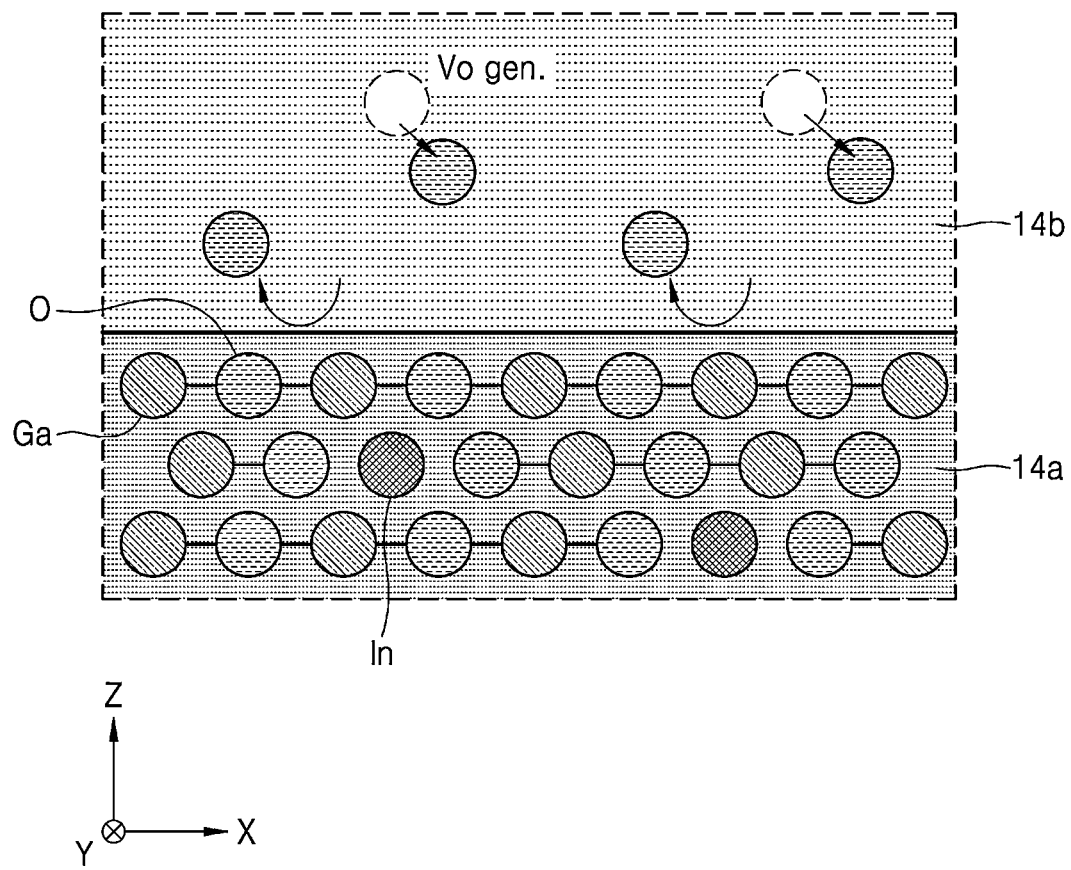

FIGS. 3 and 4 are enlarged views of a region "EN2" and a region "EN3" of FIG. 2, respectively.

In detail, FIG. 3 is provided for describing a boundary region between the second contact structure CT1b and the third region 14c of the channel layer 14 of FIG. 2. The out diffusion of oxygen (O) may be prevented by a strong bond of Ga and O at an interface between the second contact structure CT1b and the third region 14c of the channel layer 14, and the penetration of impurities (for example, hydrogen (H) or chlorine (Cl)) from the second contact structure CT1b may be prevented, thereby enhancing a leakage characteristic of a semiconductor device (10 of FIG. 1).

In other words, in the third region 14c, when a composition or concentration of Ga is configured to be higher than a composition or concentration of In, an oxygen vacancy generated in the third region 14c may be reduced, and thus, a leakage characteristic of a semiconductor device (10 of FIG. 1) may be enhanced.

Also, FIG. 4 is provided for describing a boundary region between the first region 14a and the second region 14b of the channel layer 14 of FIG. 2. In an interface between the second region 14b where a composition or concentration of In is configured to be higher than a composition or concentration of Ga and the first region 14a where a composition or concentration of Ga is configured to be higher than a composition or concentration of In, a probability that an oxygen vacancy Vo occurring in the second region 14b passes through the first region 14a may be low, and thus, a density of oxygen vacancy Vo occurring in the second region 14b may be maintained.

In this case, a carrier concentration (i.e., a concentration of oxygen vacancy Vo) and carrier mobility (i.e., the mobility of oxygen vacancy Vo) in the second region 14b may be enhanced, and thus, a channel characteristic (i.e., a channel-on characteristic) of a semiconductor device (10 of FIG. 1) may be enhanced.

Figure 5:
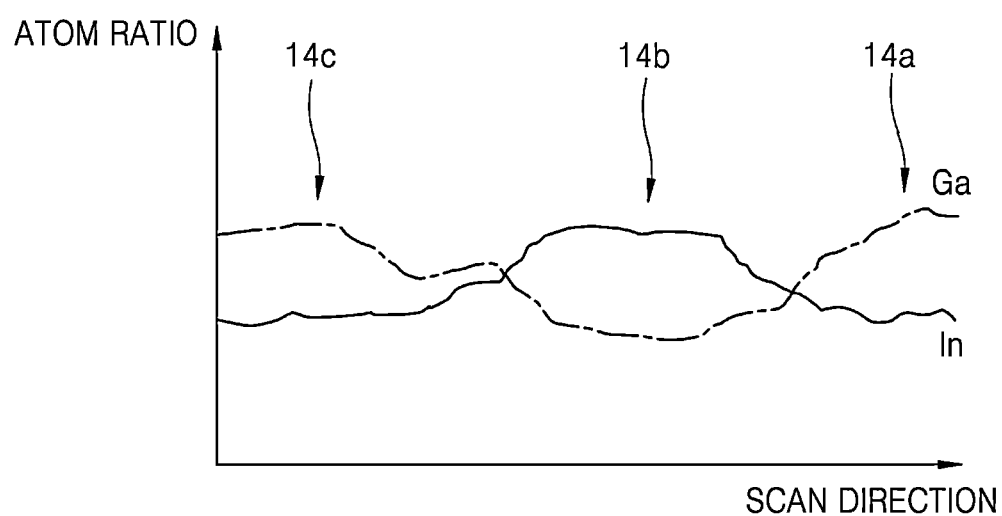
FIG. 5 is a diagram illustrating a change in an atomic composition or concentration based on a scan direction of FIG. 2.

FIG. 5 is a diagram illustrating a change in an atomic composition or concentration based on a scan direction of FIG. 2.

In detail, FIG. 5 is a diagram illustrating a composition or concentration ratio of Ga and In of a channel layer (14 of FIG. 2) based on a scan direction SC of FIG. 2. The scan direction SC may be a direction from the third region 14c of the channel layer 14 to the first region 14a thereof.

In a channel layer (14 of FIG. 2), a composition or concentration of Ga may not be discrete and may continuously increase or decrease in the direction from the third region 14c to the first region 14a. That is, a composition or concentration of Ga in the third region 14c may be large, a composition or concentration of Ga in the second region 14b may be small, and a composition or concentration of Ga in the third region 14c may be large.

In a channel layer (14 of FIG. 2), a composition or concentration of In may not be discrete and may continuously increase or decrease in the direction from the third region 14c to the first region 14a. That is, a composition or concentration of In in the third region 14c may be large, a composition or concentration of In in the second region 14b may be large, and a composition or concentration of In in the third region 14c may be small.

Overall, in the third region 14c and the first region 14a of the channel layer (14 of FIG. 2), a composition or concentration of Ga may be large and a composition or concentration of In may be small. In the second region 14b of the channel layer (14 of FIG. 2), a composition or concentration of In may be large and a composition or concentration of Ga may be small.

Figure 6:
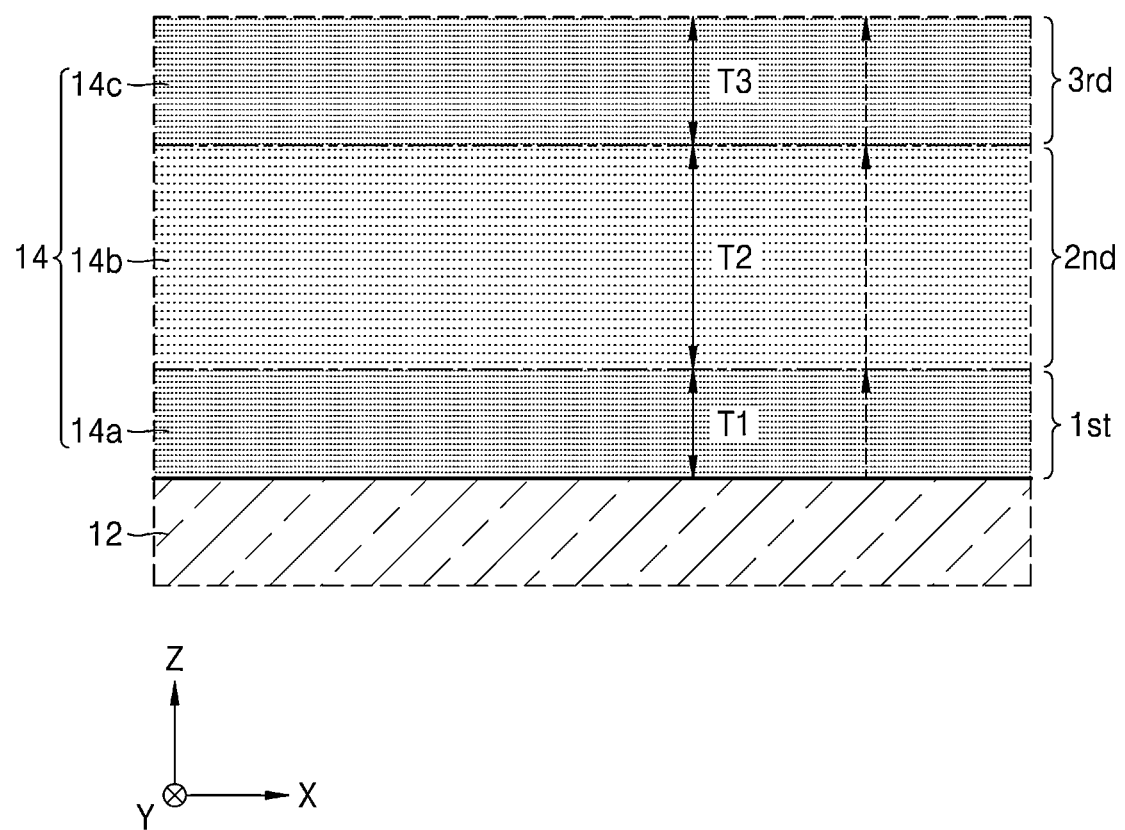
FIG. 6 is a cross-sectional view for describing a method of manufacturing a channel layer illustrated in FIG. 2.

FIG. 6 is a cross-sectional view for describing a method of manufacturing a channel layer illustrated in FIG. 2.

In detail, as described above, a channel layer 14 may include a first region 14a, a second region 14b, and a third region 14c. In FIG. 6, a thickness T2 of the second region 14b may be greater than thicknesses T1 and T3 of the first region 14a and the third region 14c and the thickness T1 of the first region 14a may be the same as the thickness T3 of the third region 14c, but the inventive concepts are not limited thereto.

The channel layer 14 may be formed by using an atomic layer deposition (ALD) process, a physical vapor deposition (PVD) process, or a chemical vapor deposition (CVD) process. The first region 14a, the second region 14b, and the third region 14c each configuring the channel layer 14 may be formed an in situ scheme at a time without moving from a deposition chamber to an external space.

As described above, atomic composition or concentrations of the first region 14a, the second region 14b, and the third region 14c each configuring the channel layer 14 may differ. In FIG. 6, an example where the channel layer 14 includes $In_xGa_yZn_zO$ (IGZO) will be described. Here, X may be 0.3 to 0.6, Y may be about 0.3 to about 0.6, Z may be about 0.1 to about 0.4, and X+Y+Z may be about 1.

In a case where the channel layer 14 is formed by using an ALD process, the first region 14a of the channel layer 14 may be formed by increasing the number of sub-cycles of a Ga source in a first operation (1st). In a second operation (2nd), the second region 14b of the channel layer 14 may be formed by decreasing the number of sub-cycles of the Ga source and increasing the number of sub-cycles of an In source. In a third operation (3rd), like the first operation (1st), the third region 14c of the channel layer 14 may be formed by increasing the number of sub-cycles of the Ga source. In the first operation (1st), the second operation (2nd), and the third operation (3rd), the number of sub-cycles of a Zn source may be adjusted to be equal.

In a case where the channel layer 14 is formed by using a PVD process, the first region 14a of the channel layer 14 may be formed through a deposition process by using an $In_xGa_yZn_zO$ (IGZO) target where a Ga ratio is high, in the first operation (1st). The second region 14b of the channel layer 14 may be formed through a deposition process by using an $In_xGa_yZn_zO$ (IGZO) target where a Ga ratio is low and an In ratio is high, in the second operation (2nd). In the third operation (3rd), like the first operation (1st), the third region 14c of the channel layer 14 may be formed through a deposition process by using an $In_xGa_yZn_zO$ (IGZO) target where a Ga ratio is high.

In a case where the channel layer 14 is formed by using a CVD process, the first region 14a of the channel layer 14 may be formed through a deposition process by increasing a ratio of a Ga source in the first operation (1st). In the second operation (2nd), the second region 14b of the channel layer 14 may be formed through a deposition process by decreasing a ratio of a Ga source and increasing a ratio of an In source. In the third operation (3rd), like the first operation (1st), the third region 14c of the channel layer 14 may be formed through a deposition process by increasing a ratio of a Ga source.

As described above, in the channel layer 14, the first region 14a, the second region 14b, and the third region 14c where atomic composition or concentrations differ may be formed by various processes.

Figure 7:
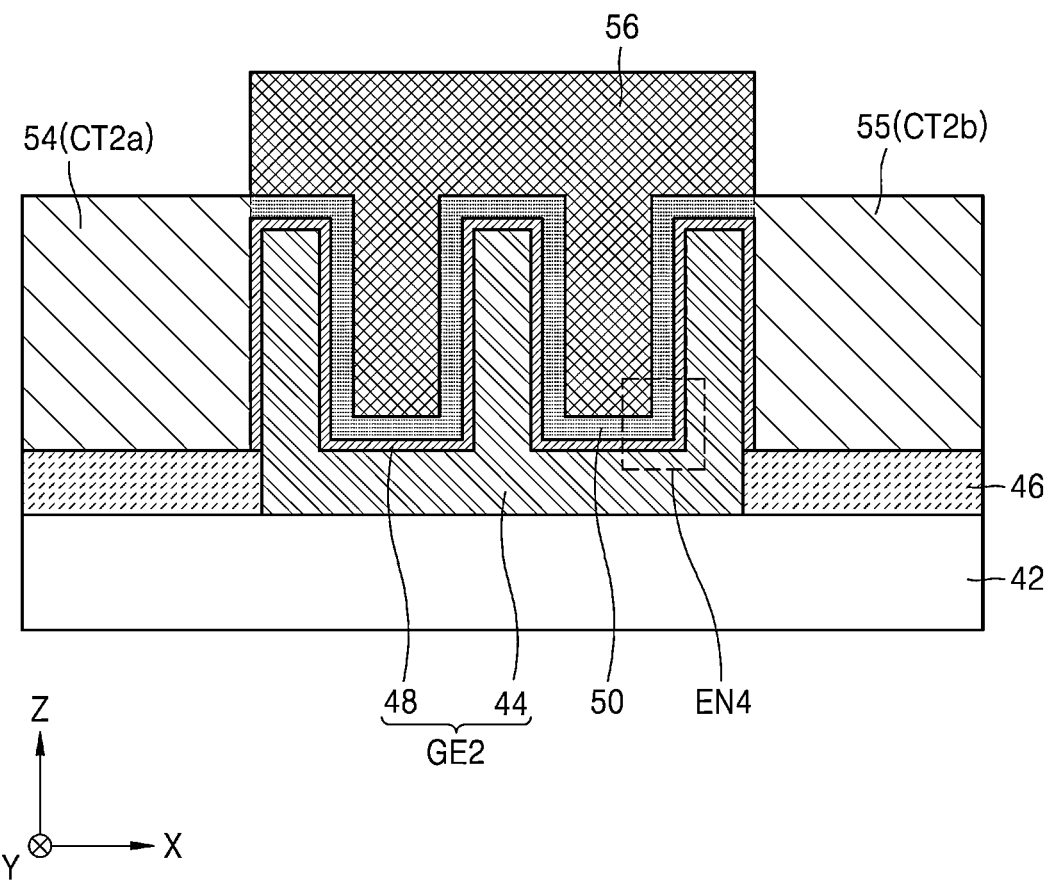
FIG. 7 is a cross-sectional view illustrating a semiconductor device according to an example embodiment.
Figure 8:
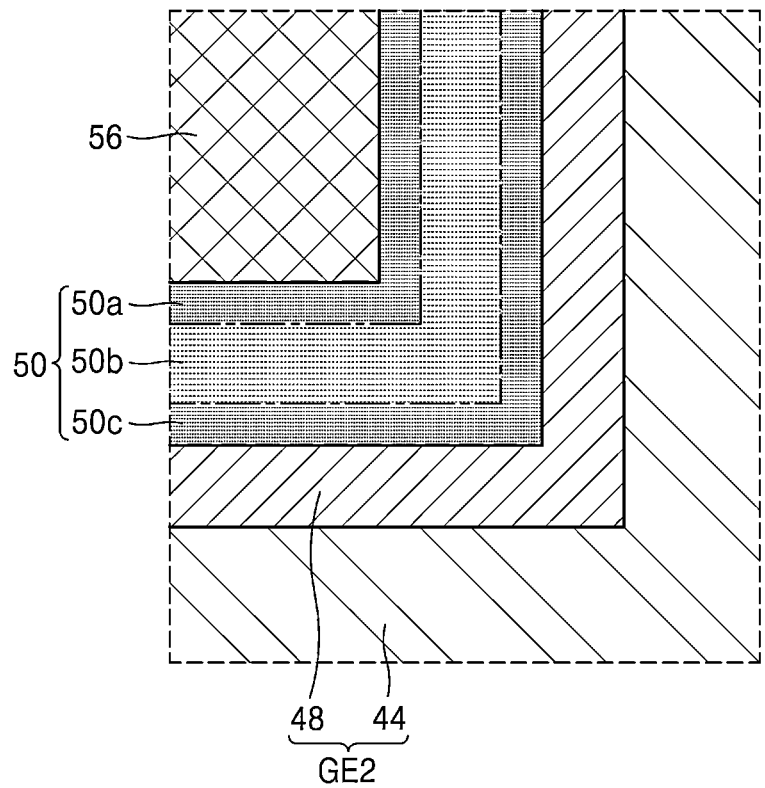
FIG. 8 is an enlarged view of a region "EN4" of FIG. 7.

FIG. 7 is a cross-sectional view illustrating a semiconductor device 40 according to an example embodiment, and FIG. 8 is an enlarged view of a region "EN4" of FIG. 7.

In detail, except for that a gate structure GE2 is formed under a channel layer 50, the semiconductor device 40 may be almost the same as the semiconductor device 10 of FIG. 1. In FIG. 7, the same description as FIG. 1 will be briefly given or is omitted.

The semiconductor device 40 may be referred to as a transistor. The semiconductor device 40 may include a substrate 42, a gate structure GE2, a channel layer 50, a first contact structure CT2a, a second contact structure CT2b, and an insulation structure 56. The substrate 42 may include a silicon substrate.

The gate structure GE2 may be limited and formed on the substrate 42 by an insulation layer 46. The gate structure GE2 may include a gate electrode 44 formed on the substrate 42 and a gate insulation layer 48 formed on the gate electrode 44.

In FIG. 7, the gate electrode 44 is illustrated as including a concave-convex portion, but the inventive concepts are not limited thereto. The gate insulation layer 48 may be formed on the gate electrode 44 including the concave-convex portion. The gate electrode 44 and the gate insulation layer 48 may respectively the same materials as those of the gate electrode 26 and the gate insulation layer 22 of FIG. 1.

The channel layer 50 may be formed on the gate structure GE2. The channel layer 50 may be formed on the gate insulation layer 48. The channel layer 50 may be formed along an upper portion of the gate electrode 44 including the concave-convex portion. The channel layer 50 may include the same material as that of the channel layer 14 of FIG. 1. For example, the channel layer 50 may include In, Ga, and O. In some example embodiments, the channel layer 50 may include $In_xGa_yZn_zO$ (IGZO), X may be about 0.3 to about 0.6, Y may be about 0.3 to about 0.6, Z may be about 0.1 to about 0.4, and X+Y+Z may be about 1.

As illustrated in FIG. 8, the channel layer 50 may include a first region 50a which disposed away from the gate structure GE2, a third region 50c which contacts the gate structure GE2, and a second region 50b which is disposed between the first region 50a and the third region 50c. The second region 50b, as illustrated in FIG. 8, may be thicker than the first region 50a and the third region 50c.

The first region 50a, the second region 50b, and the third region 50c may respectively correspond to the first region 14a, the second region 14b, and the third region 14c of FIG. 1. That is, the first region 50a and the third region 50c may be configured so that a composition or concentration of Ga is higher than a composition or concentration of In. The second region 50b may be configured so that a composition or concentration of In is higher than a composition or concentration of Ga.

The insulation structure 56 may be formed on the channel layer 50. The first contact structure CT2a may be formed in connection with the channel layer 50 at one side of the gate structure GE2. The first contact structure CT2a may include a first contact layer 54 (or a first contact region) which is formed in connection with the channel layer 50. The first contact structure CT2a may include a source contact structure.

The second contact structure CT2b may be formed in connection with the channel layer 50 at the other side of the gate structure GE2. The second contact structure CT2b may include a second contact layer 55 (or a second contact region) which is formed in connection with the channel layer 50. The second contact structure CT2b may include a drain contact structure. As described above, the semiconductor device 40 may enhance the performance of a transistor (for example, all of a leakage characteristic and a channel characteristic (i.e., a channel-on characteristic).

Figure 9:
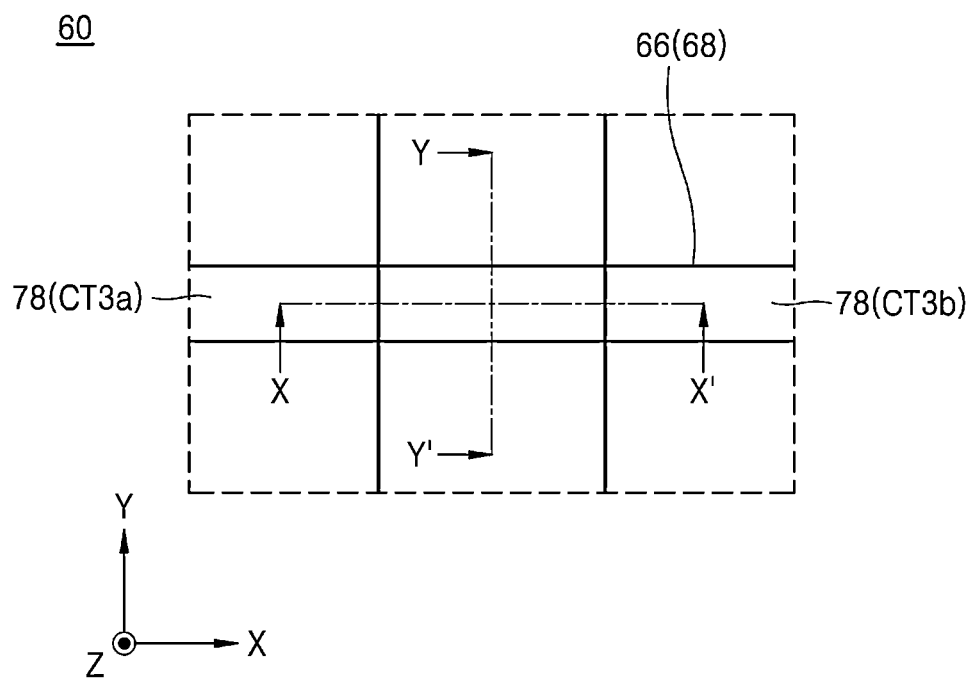
FIG. 9 is a layout diagram of a semiconductor device according to an example embodiment.
Figure 10:
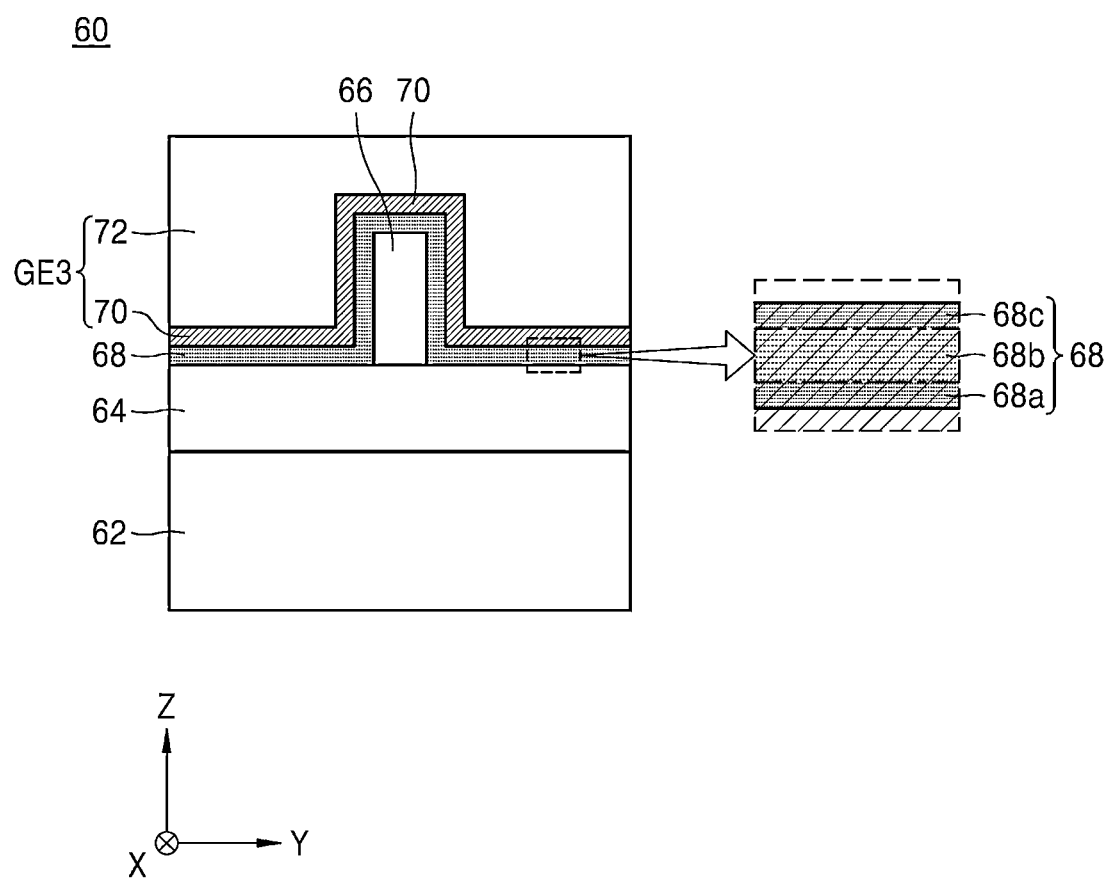
FIG. 10 is a cross-sectional view taken along line X-X' of FIG. 9.
Figure 11:
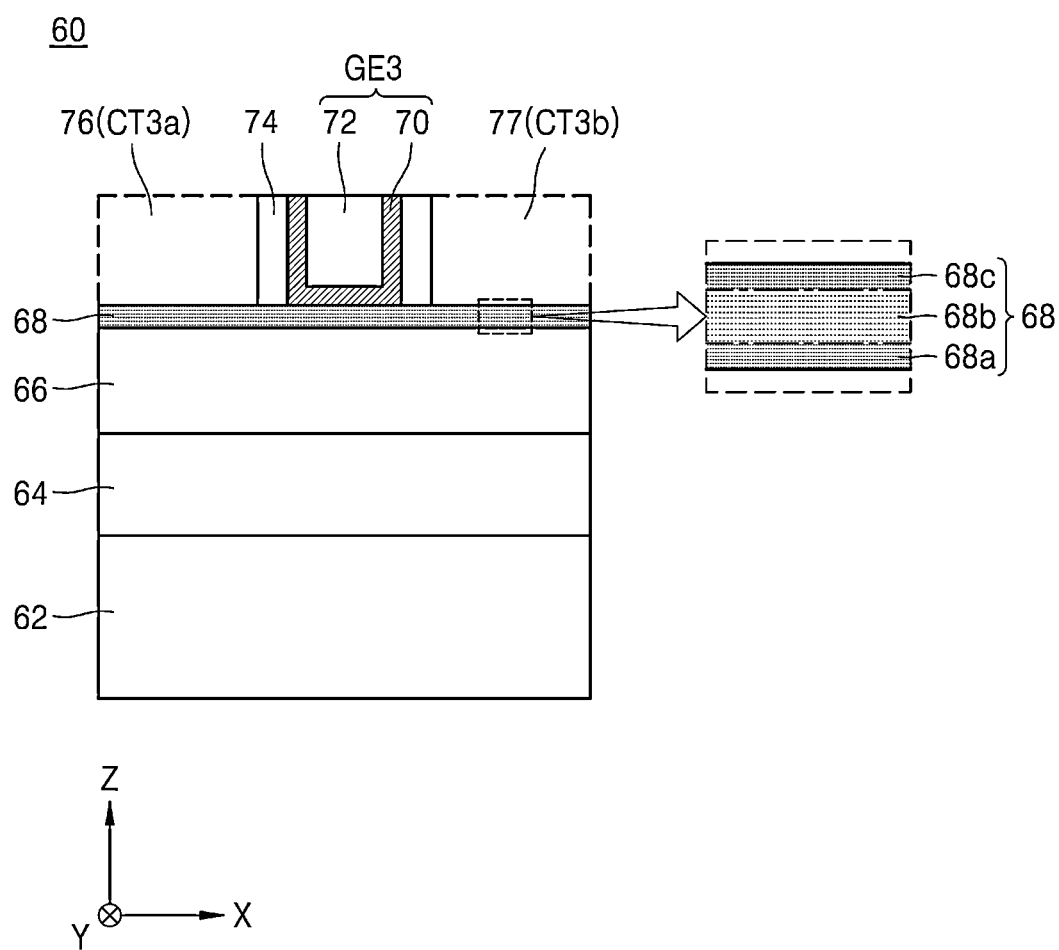
FIG. 11 is a cross-sectional view taken along line Y-Y' of FIG. 9.

FIG. 9 is a layout diagram of a semiconductor device 60 according to an example embodiment, FIG. 10 is a cross-sectional view taken along line X-X' of FIG. 9, and FIG. 11 is a cross-sectional view taken along line Y-Y' of FIG. 9.

In detail, except for that a channel layer 68 is formed in a fin type structure, the semiconductor device 60 may be almost the same as the semiconductor device 10 of FIG. 1. In FIGS. 9 to 11, the same descriptions as FIG. 1 will be briefly given or are omitted.

The semiconductor device 60 may include a fin type field effect transistor (FINFET). As illustrated in FIG. 9, in the semiconductor device 60, a fin type active region 66 and the channel layer 68 may be disposed to extend in a first direction (an X direction), and a gate structure GE3 including a gate electrode 72 may be disposed to extend in a second direction (a Y direction) vertical to the first direction.

The semiconductor device 60, as illustrated in FIGS. 10 and 11, may include a substrate 62, an insulation layer 64, the fin type active region 66, the channel layer 68, the gate structure GE3, a first contact structure CT3a, and a second contact structure CT3b. The fin type active region 66 may be referred to as a fin type active pattern. The substrate 62 may include a silicon substrate.

The insulation layer 64 may be formed on the substrate 62. The fin type active region 66 may be formed on the insulation layer 64. The fin type active region 66, as illustrated in FIG. 10, may include a fin type pattern which protrudes in a vertical direction (a Z direction) from the substrate 62 and the insulation layer 64 in the second direction (the Y direction). The fin type active region 66, as illustrated in FIG. 11, may be formed to have a uniform thickness on the insulation layer 64 in the first direction (the X direction).

The channel layer 68 may be formed on the fin type active region 66. The channel layer 68 may include the same material as that of the channel layer 14 of FIG. 1. For example, the channel layer 68 may include In, Ga, and O. In some example embodiments, the channel layer 68 may include $In_xGa_yZn_zO$ (IGZO), X may be about 0.3 to about 0.6, Y may be about 0.3 to about 0.6, Z may be about 0.1 to about 0.4, and X+Y+Z may be about 1.

The channel layer 68, as illustrated in FIG. 10, may include a fin type structure surrounding the fin type active region 66 in the second direction (the Y direction). In other words, the channel layer 68 may include a fin type structure protruding from the substrate 62. The channel layer 68, as illustrated in FIG. 11, may be formed on the fin type active region 66 in the first direction (the X direction).

The gate structure GE3 may be formed on the channel layer 68. The gate structure GE3 may include a gate insulation layer 70 and a gate electrode 72. The gate structure GE3 may be formed to surround the channel layer 68 including the fin type structure.

As illustrated in FIG. 11, a gate spacer 74 may be formed on both sidewalls of the gate structure GE3. The gate insulation layer 72 and the gate electrode 72 may respectively include the same materials as those of the gate insulation layer 22 and the gate electrode 26 of FIG. 1.

As illustrated in FIGS. 10 and 11, the channel layer 68 may include a first region 68a which is disposed away from the gate structure GE3, a third region 68c which contacts the gate structure GE3, and a second region 68b which is disposed between the first region 68a and the third region 68c. The second region 68b, as illustrated in FIGS. 10 and 11, may be thicker than the first region 68a and the third region 68c.

The first region 68a, the second region 68b, and the third region 68c may respectively correspond to the first region 14a, the second region 14b, and the third region 14c of FIG. 1. That is, the first region 68a and the third region 68c may be configured so that a composition or concentration of Ga is higher than a composition or concentration of In. The second region 68b may be configured so that a composition or concentration of In is higher than a composition or concentration of Ga.

As illustrated in FIG. 11, the first contact structure CT3a may be formed on the channel layer 68 at one side of the gate structure GE3. The first contact structure CT3a may include a first contact layer 76 (or a first contact region). The first contact structure CT3a may include a source contact structure.

The second contact structure CT3b may be formed on the channel layer 68 at the other side of the gate structure GE3. The second contact structure CT3b may include a second contact layer 77 (or a second contact region). The second contact structure CT3b may include a drain contact structure. As described above, the semiconductor device 60 may enhance the performance of a transistor (for example, all of a leakage characteristic and a channel characteristic (i.e., a channel-on characteristic).

Figure 12:
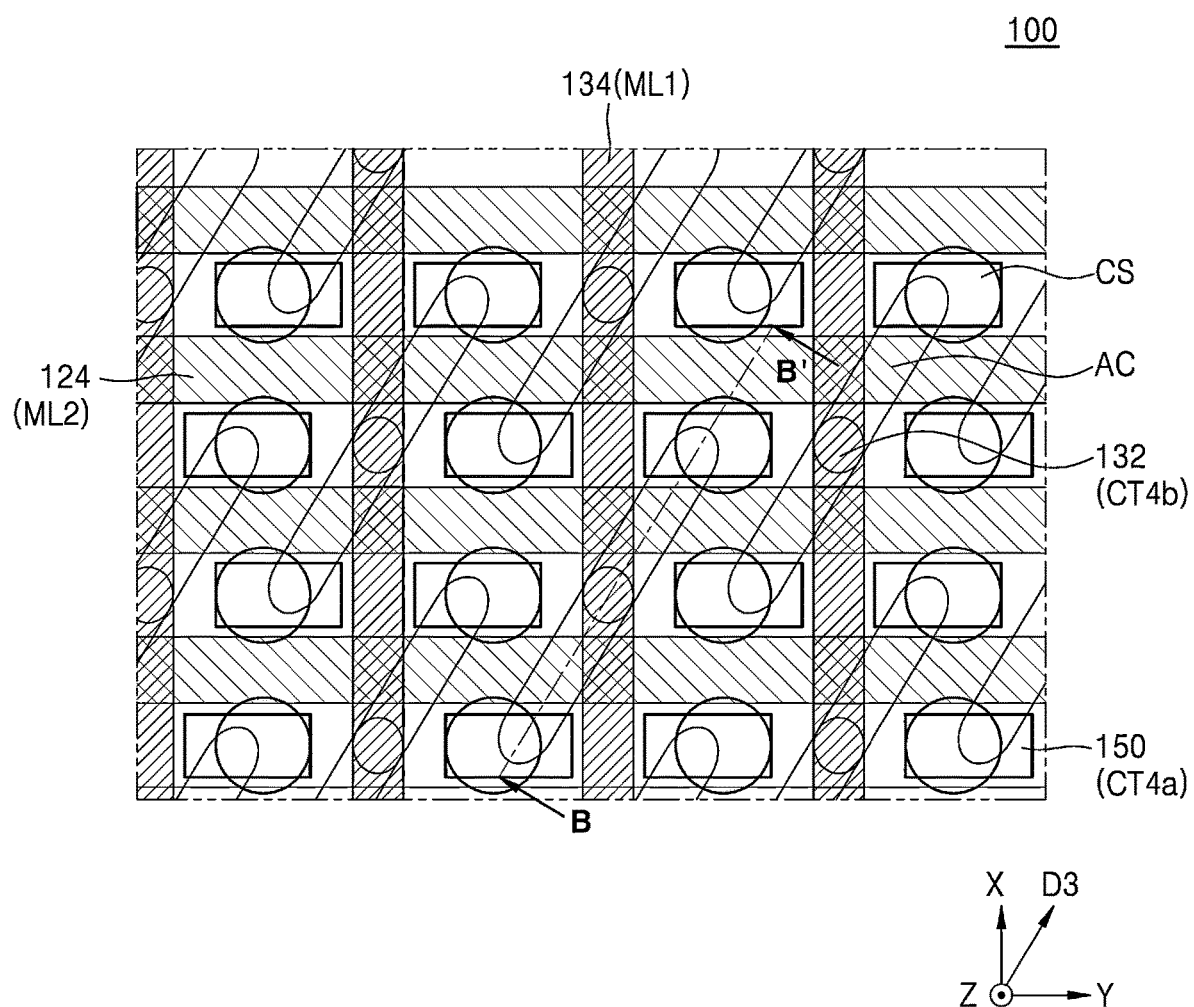
FIG. 12 is a layout diagram of a semiconductor device according to an example embodiment.
Figure 13:
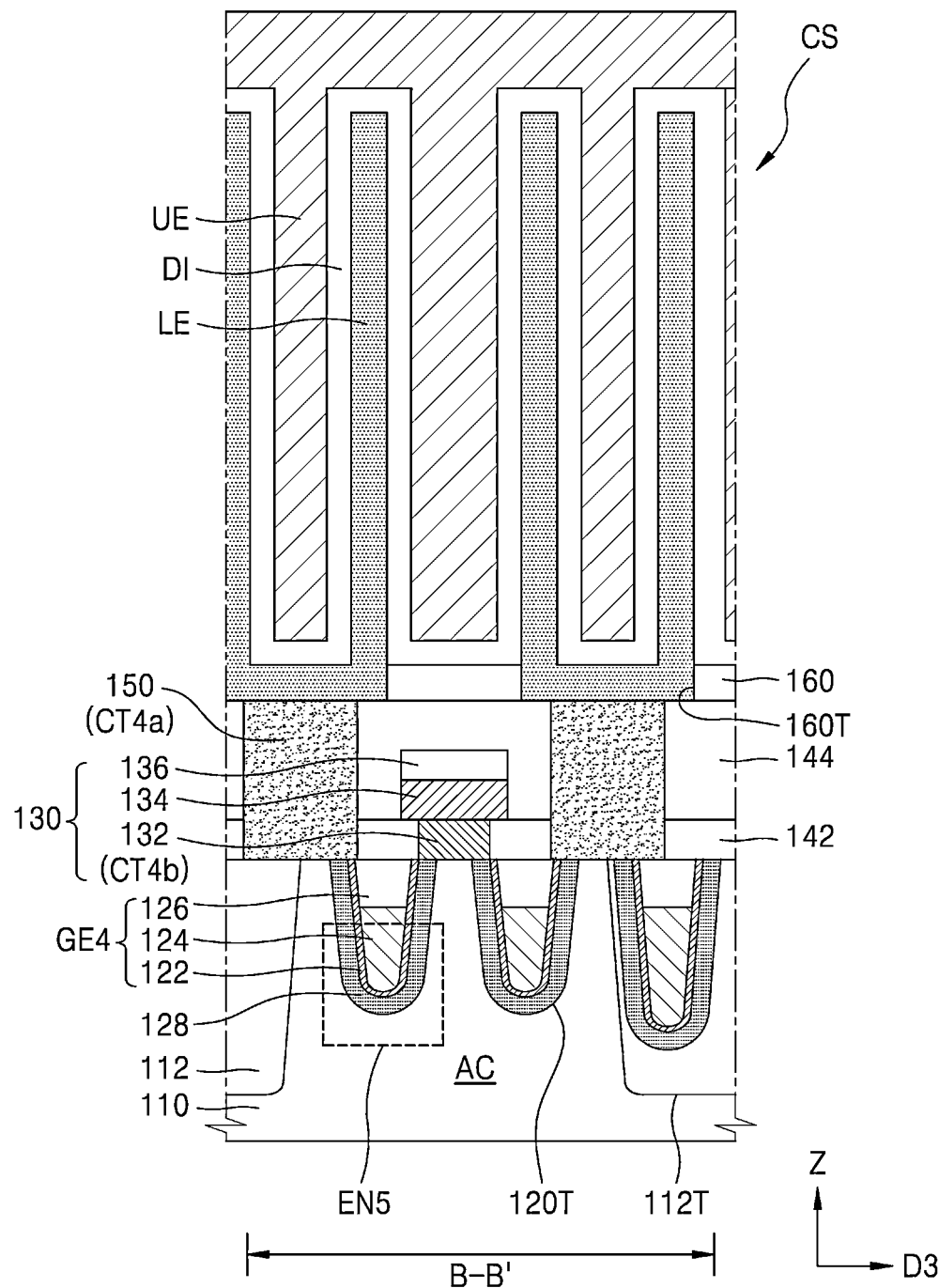
FIG. 13 is a cross-sectional view taken along line B-B' of FIG. 12.
Figure 14:
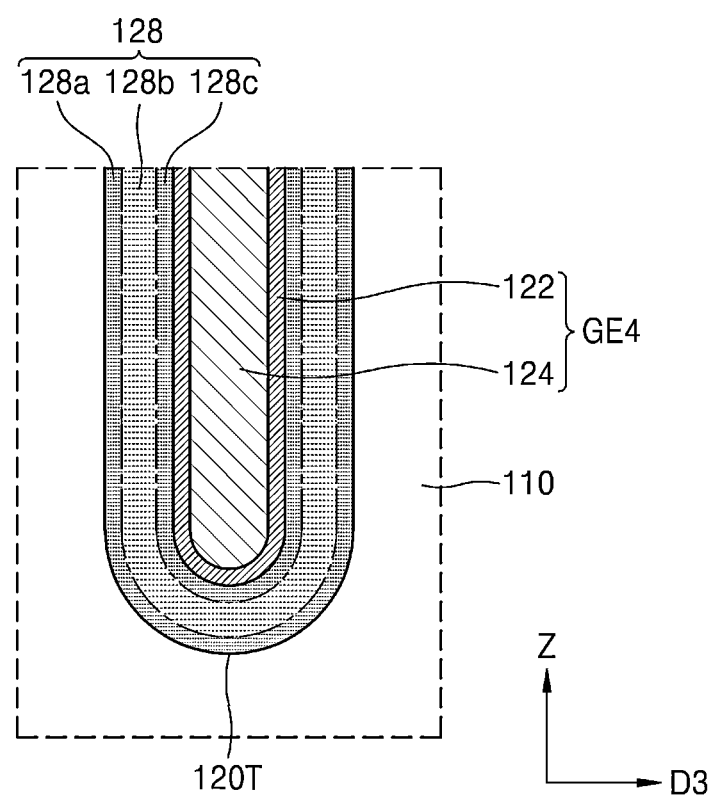
FIG. 14 is an enlarged view of a region "EN5" of FIG. 12.

FIG. 12 is a layout diagram of a semiconductor device 100 according to an example embodiment, FIG. 13 is a cross-sectional view taken along line B-B' of FIG. 12, and FIG. 14 is an enlarged view of a region "EN5" of FIG. 12.

In detail, except for that a channel layer 128 is formed in a substrate 110 and further includes a capacitor structure CS, the semiconductor device 100 may be the same as the semiconductor device 10 of FIG. 1. In FIGS. 12 to 14, the same descriptions as FIG. 1 will be briefly given or are omitted.

The semiconductor device 100 may include a buried channel array transistor (BCAT). The semiconductor device 100 may include a dynamic random access memory (RAM) (DRAM) device. As illustrated in FIG. 12, in the semiconductor device 100, a first conductive line ML1 including a bit line 134 may be disposed to extend in a first direction (an X direction), and a second conductive line ML2 including a gate electrode 124 may be disposed to extend in a second direction (a Y direction) vertical to the first direction.

In some example embodiments, the first conductive line ML1 and the second conductive line ML2 may include doped polysilicon, metal, conductive metal nitride, conductive metal silicide, conductive metal oxide, or a combination thereof.

In some example embodiments, the first conductive line ML1 and the second conductive line ML2 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof, but is not limited thereto. The first conductive line ML1 may include a single layer or a multilayer including the materials described above.

The bit line 134, as described below, may include a bit line structure 130, and the gate electrode 124 may include a gate structure GE4. In the semiconductor device 100, an active region AC and a channel layer 128 may be disposed in a diagonal direction (a D3 direction) between a first direction (an X direction) and a second direction (a Y direction).

The semiconductor device 100, as illustrated in FIG. 13, may include a substrate 110, an isolation layer 112, the active region AC, the channel layer 128, a gate structure GE4, a first contact structure CT4a, and a second contact structure CT4b. The substrate 110 may include a silicon substrate.

The active region AC may be limited by the isolation layer 112 in the substrate 110. The isolation layer 112 may include an insulating material which fills a first trench 112T for device isolation formed in the substrate 110. A second trench 120T having a U-shaped structure for gate isolation may be formed in the substrate 110.

The channel layer 128 having a U-shaped structure and the gate structure GE4 may be formed in the second trench 120T. The channel layer 128 may be formed on an inner wall of the second trench 120T. The channel layer 128 may include the same material as that of the channel layer 14 of FIG. 1. For example, the channel layer 128 may include In, Ga, and O. In some example embodiments, the channel layer 128 may include In$_x$Ga$_y$Zn$_z$O (IGZO), X may be about 0.3 to about 0.6, Y may be about 0.3 to about 0.6, Z may be about 0.1 to about 0.4, and X+Y+Z may be about 1.

The gate structure GE4 may be formed on the channel layer 128. The gate structure GE4 may include a gate insulation layer 122, a gate electrode 124, and a gate capping layer 126, which are sequentially formed on the channel layer 128 in the second trench 120T. The gate capping layer 126 may not be formed depending on the case. The gate insulation layer 122 and the gate electrode 124 may respectively include the same materials as those of the gate insulation layer 22 and the gate electrode 26 of FIG. 1.

As illustrated in FIGS. 13 and 14, the channel layer 128 may include a first region 128a which is disposed away from the gate structure GE4, a third region 128c which contacts the gate structure GE4, and a second region 128b which is disposed between the first region 128a and the third region 128c. The second region 128b, as illustrated in FIGS. 13 and 14, may be thicker than the first region 128a and the third region 128c.

The first region 128a, the second region 128b, and the third region 128c may respectively correspond to the first region 14a, the second region 14b, and the third region 14c of FIG. 1. That is, the first region 128a and the third region 128c may be configured so that a composition or concentration of Ga is higher than a composition or concentration of In. The second region 128b may be configured so that a composition or concentration of In is higher than a composition or concentration of Ga.

As illustrated in FIG. 13, the first contact structure CT4a may be formed on the gate structure GE4 at one side thereof and the channel layer 128 at the one side thereof. The first contact structure CT4a may include a first contact layer 150 (or a first contact region). The first contact structure CT4a may include a source contact structure. The first contact layer 150 may be insulated by the first insulation layer 142 and the second insulation layer 144.

As illustrated in FIG. 13, the first contact structure CT4b may be formed on the gate structure GE4 at the other side thereof and the channel layer 128 at the other side thereof. The second contact structure CT4b may include a second contact layer 132 (or a second contact region). The second contact structure CT4b may include a drain contact structure. The second contact layer 132 may be insulated by the first insulation layer 142.

The bit line 134 and the bit line capping layer 136 may be formed on the second contact layer 132. The second contact layer 132, the bit line 134, and the bit line capping layer 136 may configure a bit line structure 130. The second contact layer 132 may include polysilicon, and the bit line 134 may include a metal material. The bit line capping layer 136 may include an insulating material such as silicon nitride or silicon oxynitride.

As described above, the semiconductor device 100 may enhance the performance of a transistor (for example, all of a leakage characteristic and a channel characteristic (i.e., a channel-on characteristic). Furthermore, in the semiconductor device 100, a capacitor structure CS may be formed on the second insulation layer 144. The capacitor structure CS may include a lower electrode LE electrically connected to the first contact layer 150, a dielectric layer DI conformally covering the lower electrode LE, and an upper electrode UE on the dielectric layer DI. An etch stop layer 160 including an opening portion 160T may be formed on the second insulation layer 144, and a bottom portion of the lower electrode LE may be disposed in the opening portion 160T of the etch stop layer 160.

Figure 15:
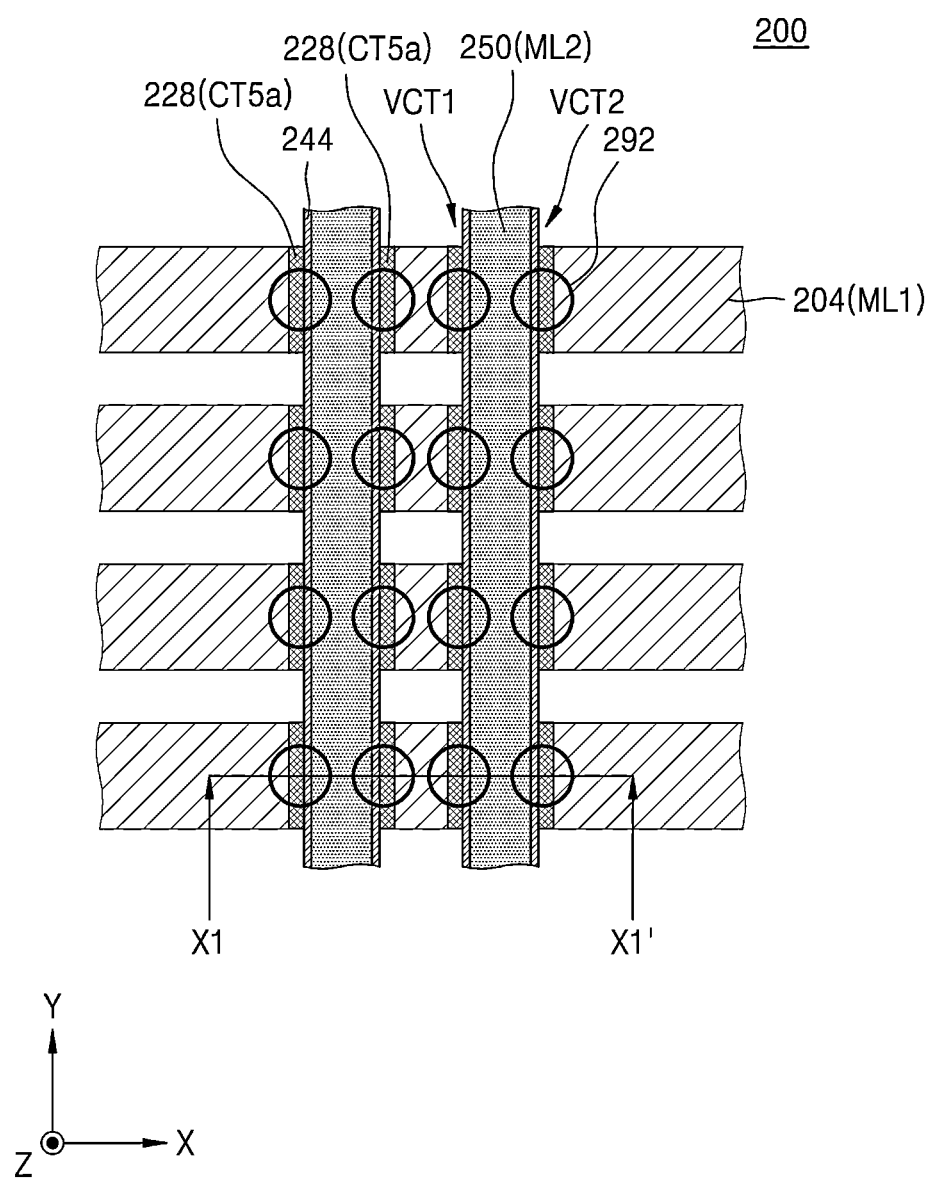
FIG. 15 is a layout diagram of a semiconductor device according to an example embodiment.
Figure 16:
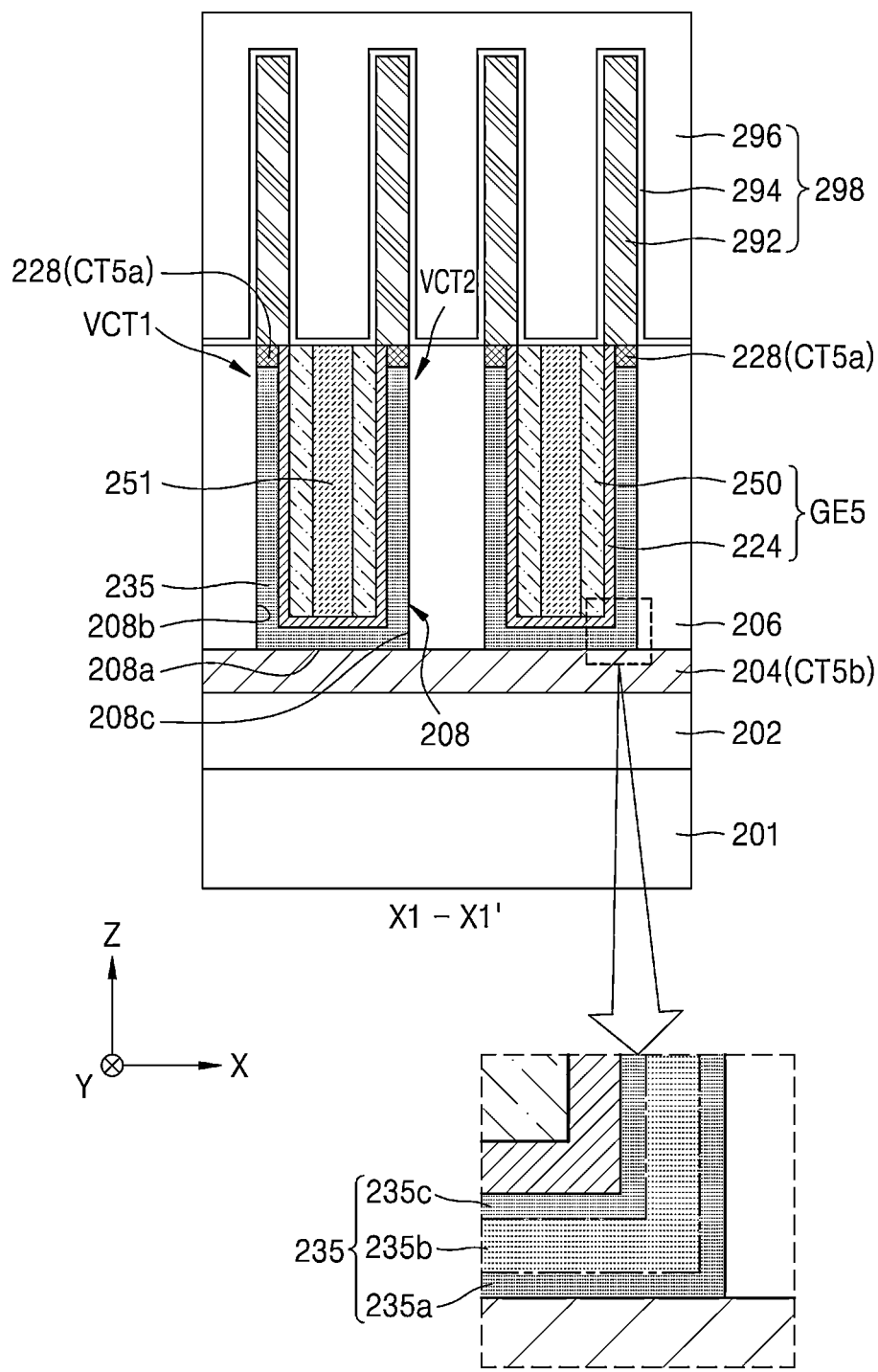
FIG. 16 is a cross-sectional view taken along line X-X' of FIG. 15.

FIG. 15 is a layout diagram of a semiconductor device 200 according to an example embodiment, and FIG. 16 is a cross-sectional view taken along line X-X' of FIG. 15.

In detail, except for that a channel layer 235 is formed in a U-shaped structure on a substrate 201 and further includes a capacitor structure CS, the semiconductor device 200 may be almost the same as the semiconductor device 10 of FIG. 1. In FIGS. 15 and 16, the same descriptions as FIG. 1 will be briefly given or are omitted.

The semiconductor device 200 may include a vertical channel transistor VCT. The vertical channel transistor VCT may have a structure where a channel length of the channel layer 235 extends in a vertical direction (i.e., a Z direction) from the substrate 201. The semiconductor device 200 may include a memory device including the vertical channel transistor VCT. The semiconductor device 200 may include a DRAM device.

As illustrated in FIG. 15, in the semiconductor device 200, a first conductive line ML1 including a bit line 204 may be arranged to extend in a first direction (an X direction), and a second conductive line ML2 including a gate electrode 250 may be arranged to extend in a second direction (a Y direction) vertical to the first direction.

As described below, the bit line 204 may include a second contact structure CT5*b*, and the gate electrode 250 may include a gate structure GE5. The first conductive line ML1 and the second conductive line ML2 may use the same material as the material described above with reference to FIG. 12.

In the semiconductor device 200, a first vertical channel transistor VCT1 may be disposed at one side of the second conductive line ML2, and a second vertical channel transistor VCT2 may be disposed at other side of the second conductive line ML2. A gate insulation layer 244 may be disposed at both sides of the gate electrode 250.

The first contact structure CT5*a* may be disposed on the channel layer 235 at the both sides of the gate electrode 250. The first contact structure CT5*a* may include a single first contact layer 228. A lower electrode 292 of a capacitor structure (298 of FIG. 16) may be disposed on the first contact structure CT5*a*.

The semiconductor device 200, as illustrated in FIG. 16, may include a substrate 201, a first isolation layer 202, a bit line 204, a second insulation layer 206, the channel layer 235, a gate structure GE5, a third insulation layer 152, a first contact structure CT5*a*, and a second contact structure CT5*b*.

The substrate 201 may include a silicon substrate. The first insulation layer 202 and the bit line 204 may be formed on the substrate 201. The second insulation layer 206 may be formed on the bit line 204. The first insulation layer 202 and the second insulation layer 206 may each include a silicon oxide layer. A U-shaped trench 208 may be formed in the second insulation layer 206.

The channel layer 235 may be formed in the U-shaped trench 208 in the second insulation layer 206. In other words, the channel layer 235 may be formed in the trench 208. The channel layer 235 may be formed on an inner wall of the trench 208. The channel layer 235 may be formed on a bottom 208*a*, one sidewall 208*b*, and the other sidewall 208*c* of the trench 208.

The channel layer 235 may include the same material as that of the channel layer 14 of FIG. 1. For example, the channel layer 235 may include In, Ga, and O. In some example embodiments, the channel layer 235 may include $In_xGa_yZn_zO$ (IGZO), X may be about 0.3 to about 0.6, Y may be about 0.3 to about 0.6, Z may be about 0.1 to about 0.4, and X+Y+Z may be about 1. The gate insulation layer 224 may be formed on the channel layer 235 in the trench 208.

The gate electrode 250 may be formed on the gate insulation layer 224 on both sidewalls of the trench 208. A third insulation layer 251 may be formed between adjacent gate electrodes 250 in the trench 208. The third insulation layer 251 may include a silicon oxide layer. The gate electrode 250 may not be isolated in the trench 208.

The gate structure GE5 may include a gate insulation layer 224 and a gate electrode 250. The gate insulation layer 224 and the gate electrode 250 may respectively include the same materials as those of the gate insulation layer 22 and the gate electrode 26 of FIG. 1.

As illustrated in FIG. 16, the channel layer 235 may include a first region 235*a* which is disposed away from the gate structure GE5, a third region 235*c* which contacts the gate structure GE5, and a second region 235*b* which is disposed between the first region 235*a* and the third region 235*c*. The second region 235*b*, as illustrated in FIG. 16, may be thicker than the first region 235*a* and the third region 235*c*.

The first region 235*a*, the second region 235*b*, and the third region 235*c* may respectively correspond to the first region 14*a*, the second region 14*b*, and the third region 14*c* of FIG. 1. That is, the first region 235*a* and the third region 235*c* may be configured so that a composition or concentration of Ga is higher than a composition or concentration of In. The second region 235*b* may be configured so that a composition or concentration of In is higher than a composition or concentration of Ga.

The first contact structure CT5*a* may contact the channel layer 235 at one side of the gate structure GE5 in a vertical direction (a Z direction). The first contact structure CT5*a* may include a single first contact layer 228 (or a first contact region). The first contact structure CT5*a* may include a source contact structure. The first contact structure CT5*a* may be insulated by the second insulation layer 206 and the third insulation layer 251.

The second contact structure CT5*b* may contact the channel layer 235 at the other side of the gate structure GE5 in the vertical direction (the Z direction). The second contact structure CT5*b* may be configured with a bit line 204. The second contact structure CT5*b* may include a drain contact structure.

As described above, the semiconductor device 200 may enhance the performance of a transistor (for example, all of a leakage characteristic and a channel characteristic (i.e., a channel-on characteristic). Furthermore, in the semiconductor device 200, a capacitor structure 298 may be further formed on the first vertical channel transistor VCT1 and the second vertical channel transistor VCT2. The capacitor structure 298 may include a lower electrode 292, a dielectric layer 294, and an upper electrode 296. The lower electrode 292 may be formed as a pillar type which extends in a third direction (the Z direction), but is not limited thereto.

Figure 17:
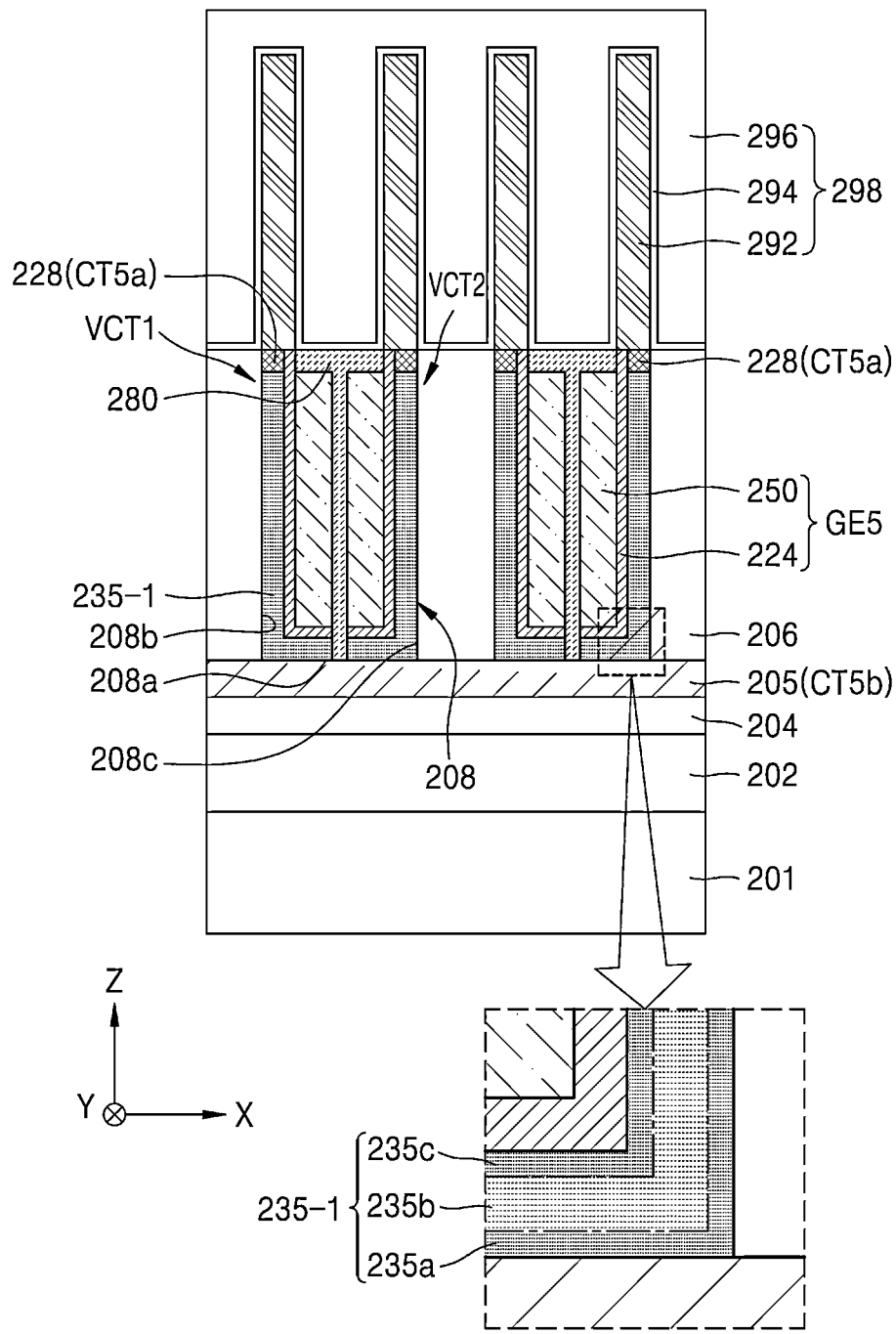
FIG. 17 is a cross-sectional view illustrating a semiconductor device according to an example embodiment.

FIG. 17 is a cross-sectional view illustrating a semiconductor device 200a according to an example embodiment.

In detail, except for that a channel layer 235-1 is isolated for each gate structure GE5 and a second contact structure CT5b is formed on a bit line 204, the semiconductor device 200a may be almost the same as the semiconductor device 200 of FIGS. 15 and 16. In FIG. 17, the same descriptions as FIGS. 15 and 16 will be briefly given or are omitted.

The semiconductor device 200a may include a bit line 204, a second insulation layer 206, a channel layer 235-1, a gate structure GE5, a fourth insulation layer 280, a first contact structure CT5a, and a second contact structure CT5b.

The channel layer 235-1 may be formed as two in the U-shaped trench 208 in the second insulation layer 206. The channel layer 235-1 may be formed on an inner wall of the trench 208. The channel layer 235-1 may be formed on a portion of a bottom 208a, one sidewall 208b, and the other sidewall 208c of the trench 208. The two channel layers 235-1 may be isolated and formed by the fourth insulation layer 280.

The channel layer 235-1 may include the same material as that of the channel layer 14 of FIG. 1. For example, the channel layer 235-1 may include In, Ga, and O. In some example embodiments, the channel layer 235 may include $In_xGa_yZn_zO$ (IGZO), X may be about 0.3 to about 0.6, Y may be about 0.3 to about 0.6, Z may be about 0.1 to about 0.4, and X+Y+Z may be about 1.

The gate insulation layer 224 may be formed on the channel layer 235-1 in the trench 208. The gate insulation layer 224 may be formed as two in the trench 208. The two gate insulation layers 224 may be isolated and formed by the fourth insulation layer 280.

The gate electrode 250 may be formed on the gate insulation layer 224 on both sidewalls of the trench 208. The gate electrode 250 may be formed as two in the trench 208. The two gate electrodes 250 may be isolated and formed by the fourth insulation layer 280. The gate structure GE5 may include a gate insulation layer 224 and a gate electrode 250. The gate insulation layer 224 and the gate electrode 250 may respectively include the same materials as those of the gate insulation layer 22 and the gate electrode 26 of FIG. 1.

As illustrated in FIG. 16, the channel layer 235-1 may include a first region 235a which is disposed away from the gate structure GE5, a third region 235c which contacts the gate structure GE5, and a second region 235b which is disposed between the first region 235a and the third region 235c. Atomic composition or concentrations of the first region 235a, the second region 235b, and the third region 235c are described above, and thus, their descriptions are omitted.

The first contact structure CT5a may contact the channel layer 235-1 at one side of the gate structure GE5 in a vertical direction (a Z direction). The first contact structure CT5a may include a single first contact layer 228 (or a first contact region). The first contact structure CT5a may include a source contact structure. The first contact structure CT5a may be insulated by the second insulation layer 206 and the third insulation layer 251.

The second contact structure CT5b may contact the channel layer 235 at the other side of the gate structure GE5 in the vertical direction (the Z direction). The second contact structure CT5b may include a single second contact layer 205 formed on the bit line 204. The second contact structure CT5b may include a drain contact structure.

As described above, the semiconductor device 200a may enhance the performance of a transistor (for example, all of a leakage characteristic and a channel characteristic (i.e., a channel-on characteristic). Furthermore, in the semiconductor device 200a, a capacitor structure 298 may be further formed on the first vertical channel transistor VCT1 and the second vertical channel transistor VCT2. The capacitor structure 298 may include a lower electrode 292, a dielectric layer 294, and an upper electrode 296.

Figure 18:
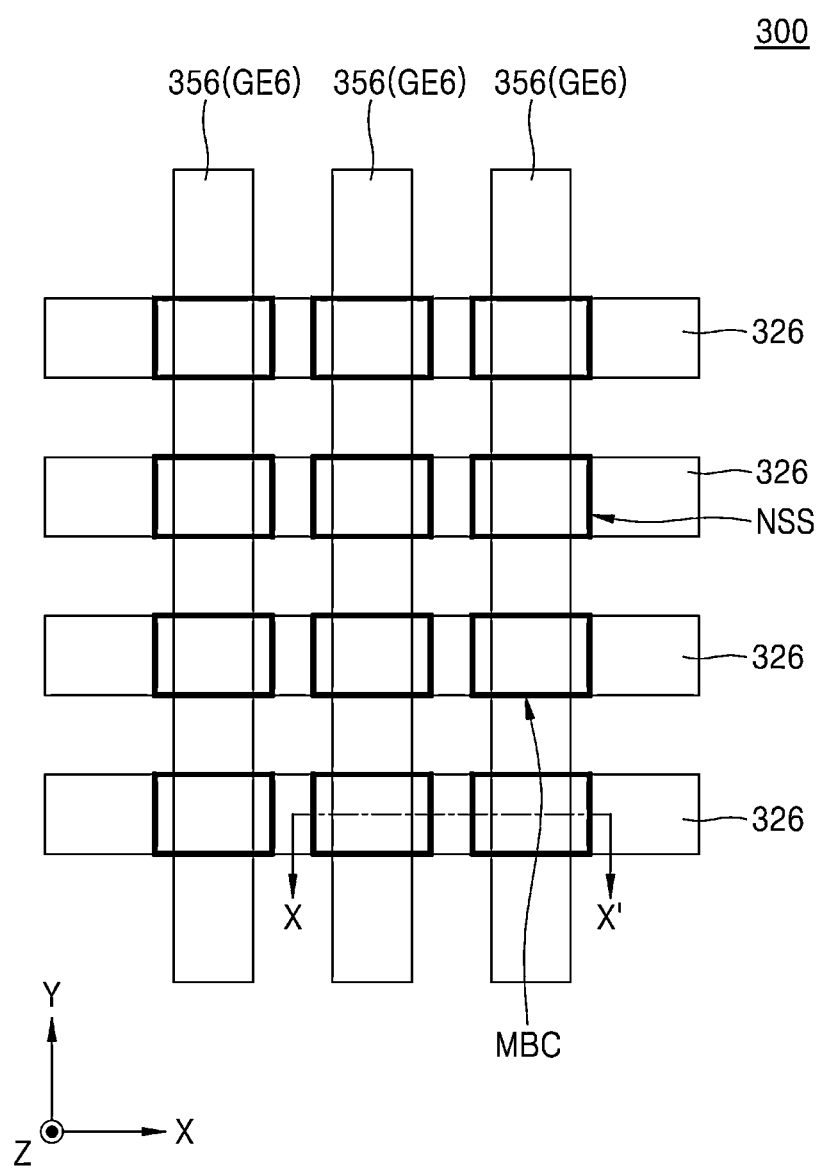
FIG. 18 is a layout diagram of a semiconductor device according to an example embodiment.
Figure 19:
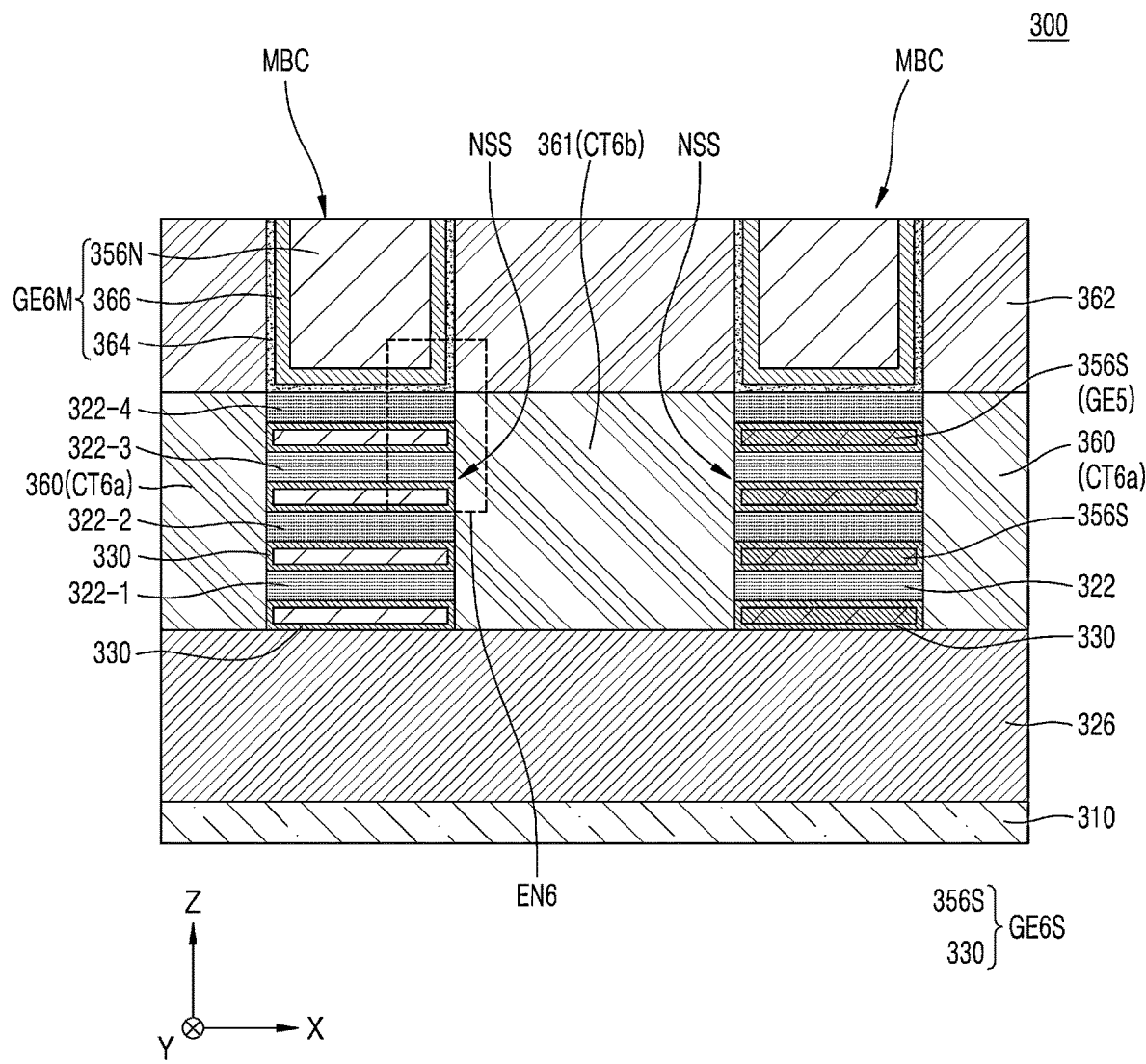
FIG. 19 is a cross-sectional view taken along line X-X' of FIG. 18.
Figure 20:
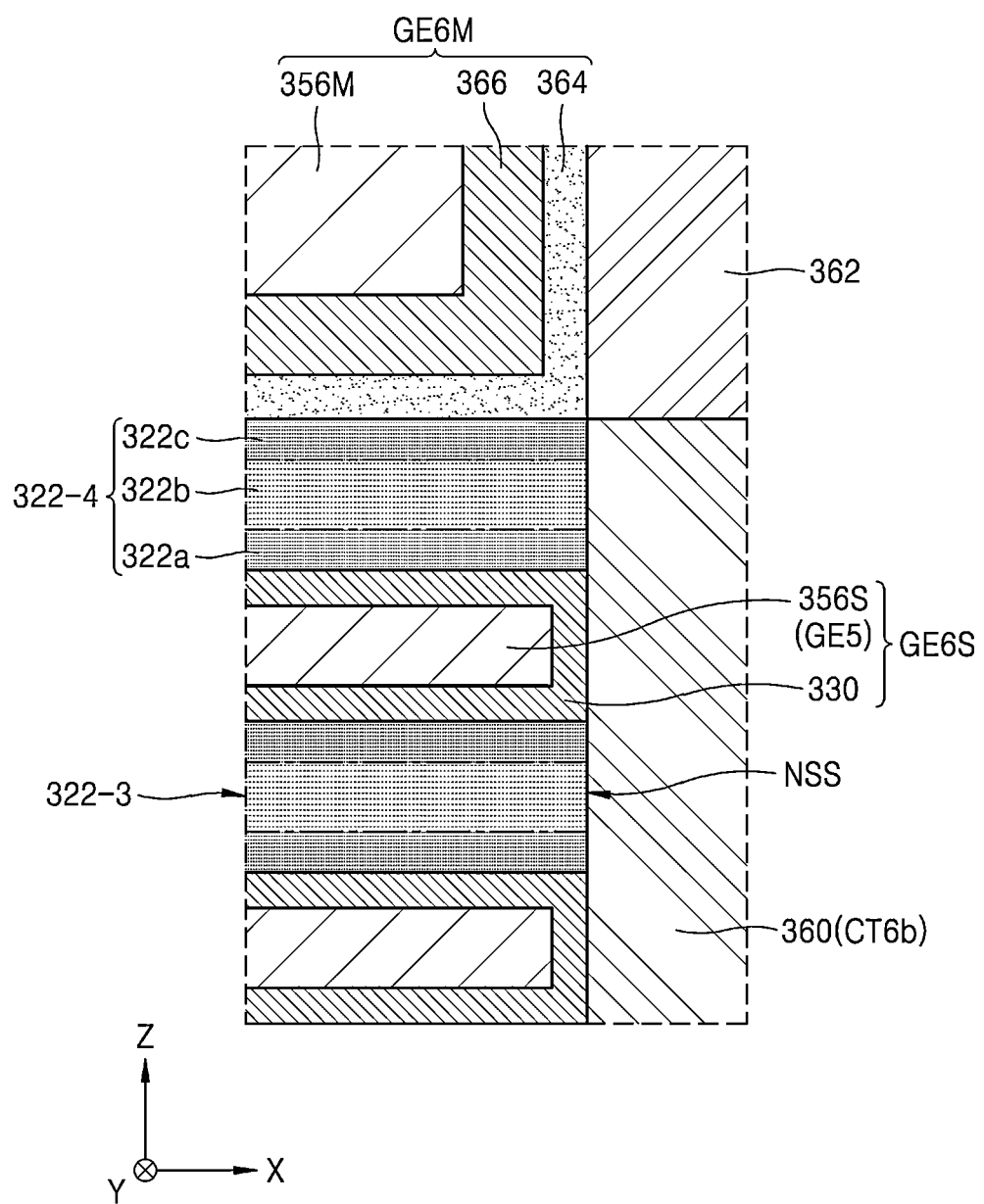
FIG. 20 is an enlarged view of a region "EN6" of FIG. 19.

FIG. 18 is a layout diagram of a semiconductor device 300 according to an example embodiment, FIG. 19 is a cross-sectional view taken along line X-X' of FIG. 18, and FIG. 20 is an enlarged view of a region "EN6" of FIG. 19.

In detail, except for that a channel layer 322 is configured with sub channel layers of a nano-sheet stack structure NSS, the semiconductor device 300 may be almost the same as the semiconductor device 10 of FIG. 1. In FIGS. 18 to 20, the same descriptions as FIG. 1 will be briefly given or are omitted.

The semiconductor device 300 may include a multi-bridge channel transistor MBC. As illustrated in FIG. 18, in the semiconductor device 300, an active region 366 may be arranged in a first direction (an X direction), and a gate structure GE6 including a gate electrode 356 may be arranged in a second direction (a Y direction) vertical to the first direction.

The nano-sheet stack structure NSS may be disposed at an overlap portion where the active region 326 intersects with the gate electrode 356. The gate structure GE6 and the nano-sheet stack structure NSS may configure the multi-bridge channel transistor MBC.

The semiconductor device 300, as illustrated in FIG. 19, may include a substrate 310, an active region AC, the nano-sheet stack structure NSS, a first contact structure CT6a, and a second contact structure CT6b.

The active region 326 may be formed on the substrate 310. The substrate 310 may include a silicon substrate. The nano-sheet stack structure NSS may be formed on the active region 326. The nano-sheet stack structure NSS may include a plurality of sub channel layers 322-1 to 322-4 which are arranged apart from one another in a vertical direction (a third direction (a Z direction)) at a surface of the substrate 310.

The sub channel layers 322-1 to 322-4 may be referred to as a channel layer 322. The sub channel layers 322-1 to 322-4 may be referred to as nano-sheets. The sub channel layers 322-1 to 322-4 may include the same material as that of the channel layer 14 of FIG. 1.

For example, the sub channel layers 322-1 to 322-4 may include In, Ga, and O. In some example embodiments, the sub channel layers 322-1 to 322-4 may include $In_xGa_yZn_zO$ (IGZO), X may be about 0.3 to about 0.6, Y may be about 0.3 to about 0.6, Z may be about 0.1 to about 0.4, and X+Y+Z may be about 1.

A plurality of sub gate structures GE6S may be formed between the sub channel layers 322-1 to 322-4. The sub gate structures GE6S may include a plurality of sub gate insulation layers 330 and a plurality of sub gate electrodes 356S. The sub gate insulation layers 330 may be arranged on and under the sub channel layers 322-1 to 322-4. The sub gate electrodes 356S may be formed on the sub gate insulation layers 330.

The sub gate insulation layers 330 may be formed to surround the sub gate electrodes 356S. The sub gate insulation layers 330 and the sub gate electrodes 356S may respectively include the same materials as those of the gate insulation layer 22 and the gate electrode 26 of FIG. 1.

The first contact structure CT6a may be formed on one side of the nano-sheet stack structure NSS, one side of each of the sub gate structures GE6S, and one side of the channel layer 322 in a horizontal direction (a first direction) on the substrate 310. The first contact structure CT6a may include a single first contact layer 360 (or a first contact region). The first contact structure CT6a may include a source contact structure.

The second contact structure CT6b may be formed on the other side of the nano-sheet stack structure NSS, the other side of each of the sub gate structures GE6S, and the other side of the channel layer 322 in the horizontal direction (the first direction) on the substrate 310. The second contact structure CT6b may include a single second contact layer 361 (or a second contact region). The second contact structure CT6b may include a source contact structure.

The semiconductor device 300 may include a main gate structure GE6M on the nano-sheet stack structure NSS. The main gate structure GE6M may be disposed on an uppermost sub channel layer 322-4. The main gate structure GE6M may include a main gate insulation layer 364, a barrier layer 366, and a main gate electrode 356M, which are formed on the uppermost sub channel layer 322-4. The sub gate structures GE6S and the main gate structure GE6M may be referred to as a gate structure.

The main gate insulation layer 364 and the main gate electrode 356M may respectively include the same materials as those of the gate insulation layer 22 and the gate electrode 26 of FIG. 1. The main gate structure GE6M may be insulated by the insulation layer 362.

The semiconductor device 300, as illustrated in FIG. 20, may include a first region 322a where the channel layer 322 (for example, the channel layer 322-4) which is disposed away from the main gate structure GE6M, a third region 322c which contacts the main gate structure GE6M, and a second region 322b which is disposed between the first region 322a and the third region 322c. The second region 322b, as illustrated in FIG. 20, may be thicker than the first region 322a and the third region 322c.

The first region 322a, the second region 322b, and the third region 322c may respectively correspond to the first region 14a, the second region 14b, and the third region 14c of FIG. 1. That is, the first region 322a and the third region 322c may be configured so that a composition or concentration of Ga is higher than a composition or concentration of In. The second region 322b may be configured so that a composition or concentration of In is higher than a composition or concentration of Ga. As described above, the semiconductor device 300 may enhance the performance of a transistor (for example, all of a leakage characteristic and a channel characteristic (i.e., a channel-on characteristic).

Figure 21:
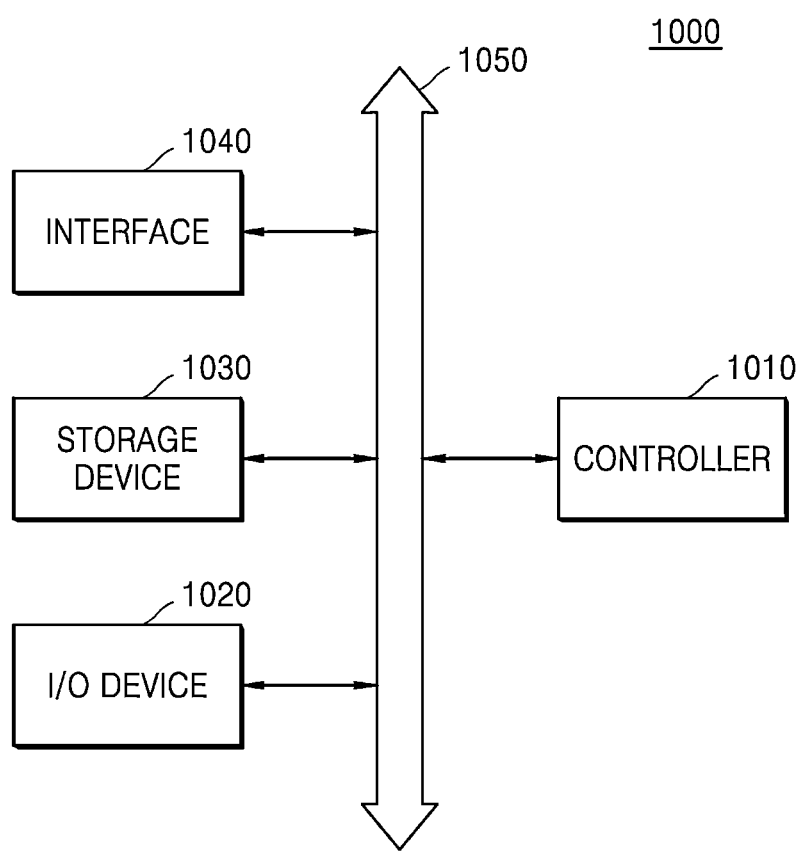
FIG. 21 is a block diagram for describing an electronic system including a semiconductor device according to an example embodiment.

FIG. 21 is a block diagram for describing an electronic system 1000 including a semiconductor device according to an example embodiment.

In detail, the electronic system 1000 may include a controller 1010, an input/output (I/O) device 1020, a storage device 1030 (or a memory device), and an interface 1040. The system 1000 may include a mobile system or a system which transmits or receives information. In some example embodiments, the mobile system may include a personal digital assistant (PDA), a portable computer, a web tablet computer, a wireless phone, a mobile phone, a digital music player, or a memory card.

The controller 1010 may be for controlling an execution program in the electronic system 1000 and may include a microprocessor, a digital signal processor, a microcontroller, or a device similar thereto. The I/O device 120 may be used to input or output data of the electronic system 1000. The electronic system 1000 may be connected to an external device (for example, a personal computer or a network) by using the I/O device 1020 and may exchange data with the external device. The I/O device 1020 may include, for example, a keypad, a keyboard, or a display.

The storage device 1030 may store a code and/or data for an operation of the controller 1010, or may store data processed in the controller 1010. The storage device 1030 and the controller 1010 may include the semiconductor devices according to example embodiments.

The interface 1040 may be a data transmission path between the electronic system 1000 and another external device. The controller 1010, the I/O device 1020, the storage device 1030, and the interface 1040 may communicate with one another through a bus 1050.

The electronic system 1000 according to an example embodiment may be applied to, for example, a mobile phone, an MP3 player, a navigation device, a portable multimedia player (PMP), a solid state disk (SSD), or household appliances.

While the inventive concepts have been particularly shown and described with reference to example embodiments thereof, it will be understood that various changes in form and details may be made therein without departing from the spirit and scope of the following claims.

What is claimed is:

1. A semiconductor device comprising:
   a channel layer on a substrate; and
   a gate structure formed on or under the channel layer, wherein
   the channel layer comprises a single-layer oxide semiconductor material,
   the channel layer comprises indium (In), gallium (Ga), and oxygen (O),
   the channel layer comprises a first region, a second region, and a third region,
   the third region contacting the gate structure, the second region being between the first region and the third region, the first region being closer to the substrate than the second region and the third region,
   each of the first region and the third region has a concentration of Ga higher than a concentration of In, and
   the second region has a concentration of In higher than a concentration of Ga.

2. The semiconductor device of claim 1, wherein, in the channel layer, a concentration of Ga increases or decreases continuously in a first direction from the third region to the first region, and a concentration of In increases or decreases continuously in a second direction from the third region to the first region.

3. The semiconductor device of claim 1, wherein the channel layer comprises at least one of $In_xGa_yZn_zO$ (IGZO), $In_xGa_ySi_zO$ (IGSO), $In_xSn_yGa_zO$ (ITGO), and $In_xGa_yO$ (IGO), where x, y, and z are positive numbers.

4. The semiconductor device of claim 1, wherein the gate structure comprises a gate insulation layer formed on the channel layer and a gate electrode formed on the gate insulation layer.

5. The semiconductor device of claim 4, wherein the channel layer is formed in a U-shaped structure and on the substrate, and the gate structure is buried into the channel layer having the U-shaped structure.

6. The semiconductor device of claim 1, wherein the channel layer is formed in a U-shaped structure and in the substrate, and the gate structure is buried into the channel layer having the U-shaped structure.

7. The semiconductor device of claim 1, wherein the channel layer comprises a fin type structure protruding from the substrate, and the gate structure is formed surrounding the channel layer including the fin type structure.

8. The semiconductor device of claim 1, wherein the channel layer comprises a plurality of sub channel layers, the plurality of sub channel layers are apart from one another in a vertical direction with respect to a surface of the substrate, and the gate structure comprises a sub gate structure between the plurality of sub channel layers.

9. The semiconductor device of claim 8, wherein the gate structure further comprises a main gate structure on an uppermost sub channel layer of the plurality of sub channel layers.

10. A semiconductor device comprising:
a channel layer on a substrate;
a gate structure formed on or under the channel layer;
a first contact structure formed on the channel layer at one side of the gate structure; and
a second contact structure formed on the channel layer at an other side of the gate structure, wherein
the channel layer comprises a single-layer oxide semiconductor material,
the channel layer comprises indium (In), gallium (Ga), and oxygen (O),
the channel layer comprises a first region, a second region, and a third region, the third region contacting the gate structure, the second region being between the first region and the third region, the first region being closer to the substrate than the second region and the third region,
each of the first region and the third region has a concentration of Ga higher than a concentration of In, and
the second region has a concentration of In higher than a concentration of Ga.

11. The semiconductor device of claim 10, wherein
the channel layer further comprises zinc (Zn) and comprises $In_xGa_yZn_zO$ (IGZO),
X is about 0.3 to about 0.6,
Y is about 0.3 to about 0.6,
Z is about 0.1 to about 0.4, and
X+Y+Z is about 1.

12. The semiconductor device of claim 10, wherein, in the channel layer, a concentration of Ga increases or decreases continuously in a first direction from the third region to the first region, and a concentration of In increases or decreases continuously in a second direction from the third region to the first region.

13. The semiconductor device of claim 10, wherein the first contact structure is apart and to the one side of the gate structure in a horizontal direction with respect to a surface of the substrate, and the second contact structure is apart from and to the other side of the gate structure in the horizontal direction with respect to the surface of the substrate.

14. The semiconductor device of claim 10, wherein the first contact structure contacts the one side of the gate structure along a vertical direction with respect to a surface of the substrate, and the second contact structure contacts the other side of the gate structure along the vertical direction with respect to the surface of the substrate.

15. A semiconductor device comprising:
a first conductive line extending in a first direction on a substrate;
a second conductive line extending in a second direction, the second direction being vertical to the first direction on the substrate; and
a transistor between the first conductive line and the second conductive line,
wherein
the transistor comprises
a channel layer, and
a gate structure including a gate insulation layer formed on the channel layer and a gate electrode formed on the gate insulation layer, the gate electrode including the second conductive line,
the channel layer comprises a single-layer oxide semiconductor material,
the channel layer comprises indium (In), gallium (Ga), and oxygen (O),
the channel layer comprises a first region, a second region, and a third region,
the third region contacting the gate electrode, and the second region between the first region and the third region, the first region being closer to the substrate than the second region and the third region,
each of the first region and the third region has a concentration of Ga higher than a concentration of In, and
the second region has a concentration of In higher than a concentration of Ga.

16. The semiconductor device of claim 15, further comprising a first contact structure formed on the channel layer to one side of the gate structure in the first direction; and a second contact structure formed on the channel layer to an other side of the gate electrode in the first direction.

17. The semiconductor device of claim 15, wherein the channel layer is formed in a fin type structure protruding from a surface of the substrate, and the gate structure is formed surrounding the channel layer having the fin type structure.

18. The semiconductor device of claim 15, wherein the channel layer is formed in a U-shaped structure in the substrate, and the gate structure is buried into the channel layer having the U-shaped structure.

19. The semiconductor device of claim 15, wherein the channel layer is formed in a U-shaped structure on the substrate, the gate structure is buried into the channel layer having the U-shaped structure, and a contact structure is further formed at an uppermost portion of the channel layer having the U-shaped structure.

20. The semiconductor device of claim 16, wherein
the channel layer comprises a plurality of sub channel layers apart from one another in a vertical direction with respect to a surface of the substrate, and
the gate structure further comprises a sub gate structure between at least two of the plurality of sub channel layers and a main gate structure on an uppermost sub channel layer of the plurality of sub channel layers.

* * * * *